(12) United States Patent
Zeng et al.

(10) Patent No.: US 12,720,988 B2
(45) Date of Patent: Aug. 25, 2026

(54) ARRAY SUBSTRATE, DISPLAY PANEL AND DISPLAY APPARATUS

(71) Applicants: Chongqing BOE Display Technology Co., Ltd., Chongqing (CN); BOE TECHNOLOGY GROUP CO., LTD., Beijing (CN)

(72) Inventors: Chao Zeng, Beijing (CN); Yuanyou Qiu, Beijing (CN); Shouqiang Zhang, Beijing (CN); Weishu Wen, Beijing (CN); Lei Zhu, Beijing (CN); Rui Wang, Beijing (CN)

(73) Assignees: Chongqing BOE Display Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 15 days.

(21) Appl. No.: 18/695,799

(22) PCT Filed: Apr. 28, 2023

(86) PCT No.: PCT/CN2023/091855
§ 371 (c)(1),
(2) Date: Mar. 26, 2024

(87) PCT Pub. No.: WO2024/221464
PCT Pub. Date: Oct. 31, 2024

(65) Prior Publication Data

US 2026/0026223 A1 Jan. 22, 2026

(51) Int. Cl.
*H10K 59/131* (2023.01)
*G09G 3/3233* (2016.01)
*H10K 59/121* (2023.01)

(52) U.S. Cl.
CPC ....... *H10K 59/1315* (2023.02); *G09G 3/3233* (2013.01); *H10K 59/1213* (2023.02); *H10K 59/1216* (2023.02)

(58) Field of Classification Search
CPC ........... H10K 59/1315; H10K 59/1213; H10K 59/131; G09G 3/3233
See application file for complete search history.

(56) References Cited

U.S. PATENT DOCUMENTS

| | | | | |
|---|---|---|---|---|
| 10,403,853 | B2 * | 9/2019 | Choung | H10K 59/122 |
| 11,653,534 | B2 * | 5/2023 | Koh | H10K 59/121 257/88 |

(Continued)

FOREIGN PATENT DOCUMENTS

| | | |
|---|---|---|
| CN | 114495835 A | 5/2022 |
| CN | 216818344 U | 6/2022 |
| CN | 115911056 A | 4/2023 |

*Primary Examiner* — Changhyun Yi
(74) *Attorney, Agent, or Firm* — The Webb Law Firm

(57) ABSTRACT

An array substrate includes a substrate and a plurality of pixel driving circuit groups, which are arranged in an array in a first direction and a second direction. Each pixel driving circuit group includes two pixel driving circuits arranged in the first direction. The array substrate includes a first conductive layer and a second conductive layer. The pixel driving circuits each include a capacitor, which includes a first electrode plate located in the first conductive layer and a second electrode plate located in the second conductive layer. A first connection pattern is connected between second electrode plates of the two pixel driving circuits in the pixel driving circuit group, and is located in the second conductive layer. A dimension of the first connection pattern in the second direction is less than a dimension of the second electrode plate in the second direction.

20 Claims, 10 Drawing Sheets

(56) References Cited

U.S. PATENT DOCUMENTS

| | | | | |
|---|---|---|---|---|
| 12,067,941 | B2 * | 8/2024 | Kim | G09G 3/3233 |
| 2019/0371236 | A1 | 12/2019 | Sakai | |
| 2024/0099080 | A1 * | 3/2024 | Kim | H10D 86/423 |

* cited by examiner

ARRAY SUBSTRATE, DISPLAY PANEL AND DISPLAY APPARATUS

CROSS-REFERENCE TO RELATED APPLICATION

This application is the United States national phase of International Patent Application No. PCT/CN2023/091855, filed Apr. 28, 2023, the disclosure of which is hereby incorporated by reference in its entirety.

BACKGROUND OF THE INVENTION

Field of the Invention

The present disclosure relates to the field of display technologies, and in particular, to array substrates, a display panel and a display apparatus.

Description of Related Art

Organic light-emitting diode (OLED) display panels have gradually become one of mainstreams in the display field due to low power consumption, high color saturation, wide viewing angle, small thickness, capable of realizing flexibility, and other excellent performances.

SUMMARY OF THE INVENTION

In an aspect, an array substrate is provided. The array substrate includes a substrate, a plurality of pixel driving circuit groups disposed on the substrate, and a first connection pattern. The plurality of pixel driving circuit groups are arranged in an array in a first direction and a second direction, the first direction intersects the second direction. Each pixel driving circuit group in the plurality of pixel driving circuit groups includes two pixel driving circuits arranged in the first direction.

The array substrate includes a first conductive layer disposed on the substrate, a second conductive layer disposed on a side of the first conductive layer away from the substrate, and power supply signal lines. The pixel driving circuits each include a driving transistor and a capacitor. The capacitor includes a first electrode plate and a second electrode plate, the first electrode plate is connected to a gate of the driving transistor, and the second electrode plate is connected to a power supply signal line. The first electrode plate is located in the first conductive layer, and the second electrode plate is located in the second conductive layer. The first connection pattern is connected between second electrode plates of two pixel driving circuits in the pixel driving circuit group, and the first connection pattern is located in the second conductive layer. A dimension of the first connection pattern in the second direction is less than a dimension of the second electrode plate in the second direction.

In some embodiments, a ratio of the dimension of the first connection pattern in the second direction to the dimension of the second electrode plate in the second direction is in a range of 10% to 50%, inclusive.

In some embodiments, the dimension of the first connection pattern in the second direction is in a range of 2.0 μm to 5.5 μm, inclusive.

In some embodiments, the array substrate further includes a shielding layer disposed between the substrate and the first conductive layer. The shielding layer includes a plurality of shielding patterns and a second connection pattern, and at least one of the pixel driving circuits includes a shielding pattern in the plurality of shielding patterns. In the first direction, between at least two adjacent pixel driving circuit groups, the second connection pattern is connected between shielding patterns of two adjacent pixel driving circuits. The array substrate further includes a second semiconductor layer, and the second semiconductor layer is located on a side of the second conductive layer away from the substrate. An orthographic projection of the second connection pattern on the substrate is overlapped with an orthographic projection of the second semiconductor layer on the substrate.

In some embodiments, the array substrate further includes a third gate dielectric layer and a third insulating layer that are disposed on a side of the second semiconductor layer away from the substrate. The third gate dielectric layer and the third insulating layer are provided with at least one first via hole therein, the at least one first via hole extends through the third gate dielectric layer and the third insulating layer to the second semiconductor layer, and an orthogonal projection of the at least one first via hole on the substrate is overlapped with the orthographic projection of the second connection pattern on the substrate.

In some embodiments, the array substrate further includes a shielding layer disposed between the substrate and the first conductive layer. The shielding layer includes a plurality of shielding patterns and a third connection pattern, and the pixel driving circuits each include a shielding pattern in the plurality of shielding patterns. In the pixel driving circuit group, the third connection pattern is connected between shielding patterns of the two pixel driving circuits. An overlapping area of an orthographic projection of the first connection pattern on the substrate and an orthographic projection of the third connection pattern on the substrate is greater than 70% of the orthographic projection of the first connection pattern on the substrate.

In some embodiments, the array substrate further includes a fourth conductive layer disposed on a side of the second conductive layer away from the substrate, and the fourth conductive layer includes a first initialization signal line and a second initialization signal line. Orthographic projections of the first initialization signal line and the second initialization signal line on the substrate are both overlapped with an orthographic projection of the first conductive layer on the substrate.

In some embodiments, in each pixel driving circuit, an overlapping area of an orthographic projection of the first initialization signal line on the substrate and the orthographic projection of the first conductive layer on the substrate is greater than an overlapping area of an orthographic projection of the second initialization signal line on the substrate and the orthographic projection of the first conductive layer on the substrate.

In some embodiments, in each pixel driving circuit, a ratio of an overlapping area of an orthographic projection of the first initialization signal line on the substrate and the orthographic projection of the first conductive layer on the substrate to an overlapping area of an orthographic projection of the second initialization signal line on the substrate and the orthographic projection of the first conductive layer on the substrate is greater than 1.5.

In some embodiments, the array substrate further includes a reset signal line. The reset signal line is located in the first conductive layer, and the orthographic projections of the first initialization signal line and the second initialization signal line on the substrate are both overlapped with an orthographic projection of the reset signal line on the substrate.

In some embodiments, the array substrate further includes a shielding layer disposed on the substrate, a first semiconductor layer, a second semiconductor layer, a third conductive layer and a fourth conductive layer, wherein the first semiconductor layer, the first conductive layer, the second conductive layer, the second semiconductor layer, the third conductive layer and the fourth conductive layer are disposed in sequence in a direction away from the shielding layer. A material of the first semiconductor layer includes low-temperature polysilicon, and a material of the second semiconductor layer includes indium gallium zinc oxide.

In some embodiments, the array substrate further includes a shielding layer disposed between the substrate and the first conductive layer; the shielding layer including a plurality of shielding patterns and a second connection pattern, and the pixel driving circuits each including a shielding pattern in the plurality of shielding patterns. In the first direction, between at least two adjacent pixel driving circuit groups, the second connection pattern is connected between shielding patterns of two adjacent pixel driving circuits. The array substrate further includes a light emission control signal line.

The pixel driving circuits each further include a second light emission control transistor. A gate of the second light emission control transistor is connected to the light emission control signal line, and a first electrode of the second light emission control transistor is connected to a second electrode of the driving transistor. Between two adjacent pixel driving circuit groups, a region between first electrodes of two adjacent second light emission control transistors and between the second connection pattern and the light emission control signal line is a first light transmissive region, and an area of the first light transmissive region is greater than 10 $\mu m^2$.

In some embodiments, the array substrate further includes a first initialization signal line, a light emission control signal line and a second scan signal line. The pixel driving circuits each further include a first reset transistor, a second light emission control transistor and a second reset transistor, and a compensation transistor. A first electrode of the first reset transistor is connected to the first initialization signal line, a second electrode of the first reset transistor is connected to a first electrode of the compensation transistor, a second electrode of the second light emission control transistor is connected to a second electrode of the second reset transistor, a first electrode of the second light emission control transistor is connected to a second electrode of the driving transistor, and a gate of the second light emission control transistor is connected to the light emission control signal line. A gate of the compensation transistor is connected to the second scan signal line.

Between two adjacent pixel driving circuit groups, a region between second electrodes of two adjacent second light emission control transistors and between the first initialization signal line and the light emission control signal line is a second light transmissive region, and an area of the second light transmissive region is greater than 10 $\mu m^2$.

In another aspect, an array substrate is provided. The array substrate includes a substrate, a plurality of pixel driving circuit groups disposed on the substrate, and a first connection pattern. The plurality of pixel driving circuit groups are arranged in an array in a first direction and a second direction, the first direction intersects the second direction. Each pixel driving circuit group includes two pixel driving circuits arranged in the first direction. The array substrate includes a first conductive layer disposed on the substrate, a second conductive layer disposed on a side of the first conductive layer away from the substrate, and a fifth conductive layer. The pixel driving circuits each include a driving transistor and a capacitor. The capacitor includes a first electrode plate and a second electrode plate, the first electrode plate is connected to a gate of the driving transistor, and the second electrode plate is connected to the fifth conductive layer.

The first electrode plate is located in the first conductive layer, and the second electrode plate is located in the second conductive layer. The first connection pattern is connected between second electrode plates of the two pixel driving circuits in the pixel driving circuit group, and the first connection pattern is located in the second conductive layer. A dimension of the first connection pattern in the second direction is less than a dimension of the second electrode plate in the second direction.

In some embodiments, the array substrate further includes a second scan signal line. The pixel driving circuits each further include a compensation transistor, a first electrode of the compensation transistor is connected to the gate of the driving transistor, a second electrode of the compensation transistor is connected to a second electrode of the driving transistor by a first pattern, and a gate of the compensation transistor is connected to the second scan signal line.

The array substrate further includes a shielding layer disposed on the substrate, a first semiconductor layer, a second semiconductor layer, a third conductive layer and a fourth conductive layer, wherein the first semiconductor layer, the first conductive layer, the second conductive layer, the second semiconductor layer, the third conductive layer and the fourth conductive layer are disposed in sequence in a direction away from the shielding layer. An active layer pattern of the driving transistor is located in the first semiconductor layer, the second scan signal line is at least partially located in the third conductive layer, an active layer pattern of the compensation transistor is located in the second semiconductor layer; and the first pattern is located in the fourth conductive layer.

In some embodiments, the first pattern is connected to the second electrode of the driving transistor through a third via, and the first pattern is further connected to the second electrode of the compensation transistor through a first via; and the first connection pattern is not overlapped with both the first via hole and the third via hole.

In some embodiments, the shielding layer includes a plurality of shielding patterns and a second connection pattern, and the pixel driving circuits each include a shielding pattern in the plurality of shielding patterns. In the first direction, between at least two adjacent pixel driving circuit groups, the second connection pattern is connected between shielding patterns of two adjacent pixel driving circuits. The second connection pattern is not overlapped with the third via hole.

In some embodiments, the shielding patterns and the second connection pattern are used to receive a constant voltage signal.

In yet another aspect, a display panel is provided. The display panel includes the array substrate as described in any of the above embodiments. The display panel further includes a plurality of light-emitting devices disposed on a plurality of pixel driving circuits in the array substrate. The array substrate is used to drive the plurality of light-emitting devices to emit light.

In yet another aspect, a display apparatus is provided. The display apparatus includes the display panel as described in any of the above embodiments. The display apparatus further includes a driver chip used to drive the display panel for display.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

DESCRIPTION OF THE INVENTION

Figure 1:
FIG. 1 is a structural diagram of a mobile phone, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "coupled" and "connected" and derivatives thereof may be used. The term "connection" should be understood in a broad sense. For example, the "connection" may be a fixed connection, a detachable connection, or of an integrated structure; it may be a direct connection or an indirect connection by an intermediate medium. The term "coupled" indicates, for example, that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The term "about", "substantially" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

The term such as "parallel", "perpendicular" or "equal" as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "parallel" includes absolute parallelism and approximate parallelism, and an acceptable range of deviation of the approximate parallelism may be a deviation within 5°; the term "perpendicular" includes absolute perpendicularity and approximate perpendicularity, and an acceptable range of deviation of the approximate perpendicularity may also be a deviation within 5°; and the term "equal" includes absolute equality and approximate equality, and an acceptable range of deviation of the approximate equality may be a difference between two equals being less than or equal to 5% of either of the two equals.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

As shown in FIG. 1, some embodiments of the present disclosure provide a display apparatus. The display apparatus provided by the embodiments of the present disclosure may be any apparatus that displays images whether in motion (such as a video) or fixed (such as a still image), and regardless of text or image. More specifically, it is expected that the embodiments may be implemented in or associated with a variety of electronic devices. The variety of electronic devices may be (but are not limited to), for example, mobile phones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, TV monitors, flat-panel displays, computer monitors, car displays (e.g., odometer displays), navigators, cockpit controllers and/or displays, camera view displays (e.g., display of rear view camera in vehicles), electronic photos, electronic billboards or signs, projectors, architectural structures, packaging and aesthetic structures (e.g., displays for displaying an image of a piece of jewelry), etc.

As shown in FIG. 1, in the embodiments of the present disclosure, the display apparatus is exemplarily described in an example of a mobile phone 1000.

Figure 2:
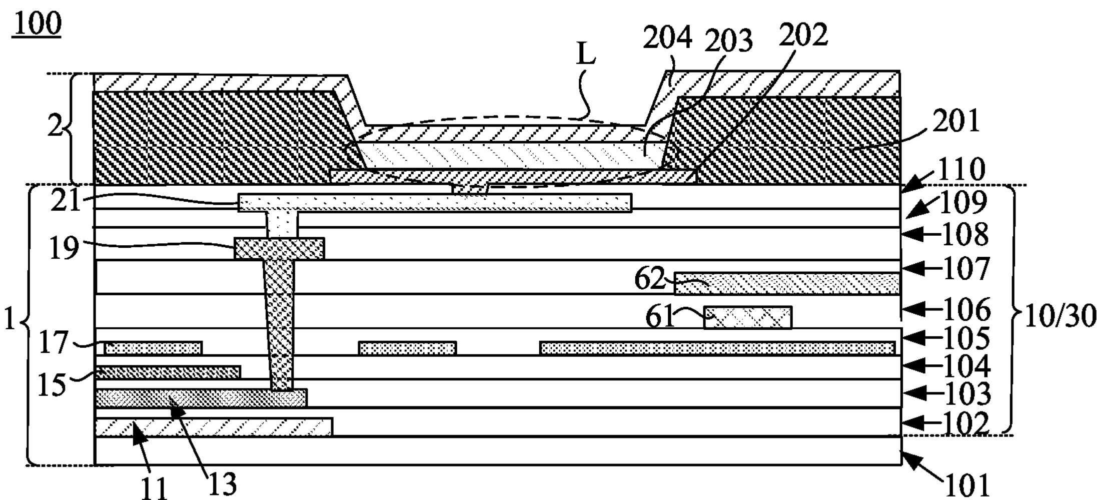
FIG. 2 is a structural diagram of a display panel, in accordance with some embodiments of the present disclosure.

As shown in FIG. 2, the mobile phone 1000 includes a display panel 100. The mobile phone 1000 further includes a frame, a circuit board, a driver chip and other electronic components. The display panel 100 is provided in the frame, and the driver chip is used to drive the display panel 100 for display.

For example, as shown in FIG. 2, the display panel 100 is an organic light-emitting diode (OLED, also referred to as an organic electroluminescent diode) display panel. The display panel 100 includes an array substrate 1 and a light-emitting device stack layer 2. The array substrate 1 includes a substrate 101 and a pixel circuit stack layer 30. The pixel circuit stack layer 30 is disposed on the substrate 101.

For example, the material of the substrate 101 may include any of glass, metal, or flexible materials.

A plurality of pixel driving circuits 10 are formed in the pixel circuit stack layer 30. For example, the pixel circuit stack layer 30 includes a shielding layer 11, a first semiconductor layer 13, a first conductive layer 15, a second conductive layer 17, a second semiconductor layer 61, a third conductive layer 62, a fourth conductive layer 19 and a fifth conductive layer 21 that are arranged in sequence.

For example, the material of the first semiconductor layer 13 includes low-temperature polysilicon, and the material of the second semiconductor layer 61 includes indium gallium zinc oxide.

It will be noted that insulating layers are also provided between functional film layers in the array substrate 1. The functional film layers include the shielding layer 11, the first semiconductor layer 13, the first conductive layer 15, the second conductive layer 17, the second semiconductor layer 61, the third conductive layer 62, the fourth conductive layer 19 and the fifth conductive layer 21.

For example, as shown in FIG. 2, the insulating layers include a first insulating layer 102, a first gate dielectric layer 103, a second gate dielectric layer 104, a second insulating layer 105, a third gate dielectric layer 106, a third insulating layer 107, a passivation layer 108, a first planarization layer 109 and a second planarization layer 110.

For example, the pixel circuit stack layer 30 includes the shielding layer 11, the first insulating layer 102, the first semiconductor layer 13, the first gate dielectric layer 103, the first conductive layer 15, the second gate dielectric layer 104, the second conductive layer 17, the second insulating layer 105, the second semiconductor layer 61, the third gate dielectric layer 106, the third conductive layer 62, the third insulating layer 107, the fourth conductive layer 19, the passivation layer 108, the first planarization layer 109, the fifth conductive layer 21 and the second planarization layer 110 that are arranged in sequence.

For example, the materials of the first planarization layer 109 and the second planarization layer 110 include polyimide, and the materials of the first insulating layer 102, the second insulating layer 105 and the third insulating layer 107 include any of silicon nitride and silicon oxide.

In some embodiments, the pixel driving circuit 10 in some embodiments of the present disclosure may be a 7T1C circuit, a 8T1C circuit, or a 9T1C circuit, where T represents a transistor, the number in front of T represents the number of the transistor(s), C represents a capacitor, and the number in front of C represents the number of the capacitor(s). For example, 7T1C represents seven transistors and one capacitor.

Figure 3A:
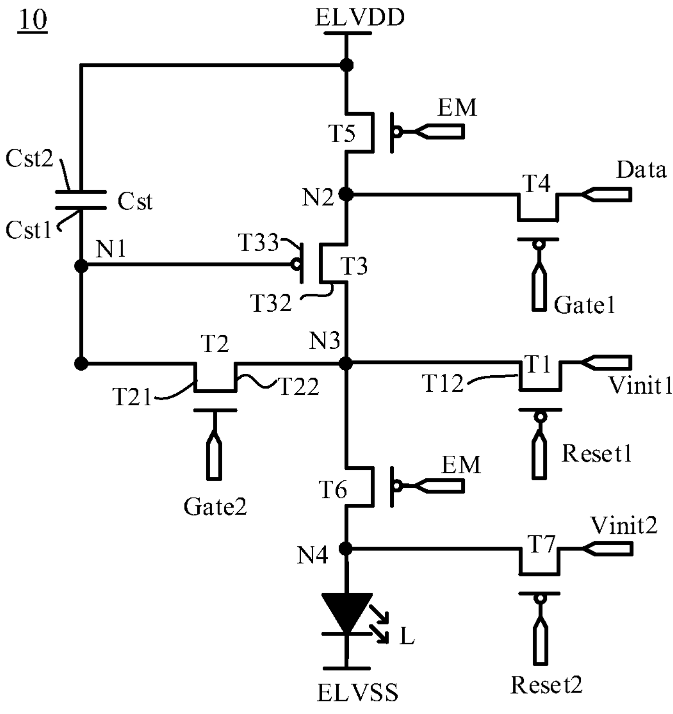
FIG. 3A is an equivalent circuit diagram of a pixel driving circuit, in accordance with some embodiments of the present disclosure.

In some embodiments, the structure of the pixel driving circuit 10 shown in FIG. 3A is introduced. The pixel driving circuit 10 is a 7T1C pixel driving circuit. The pixel driving circuit 10 includes a first reset transistor T1, a compensation transistor T2, a driving transistor T3, a data writing transistor T4, a first light emission control transistor T5, a second light emission control transistor T6 and a second reset transistor T7.

For example, as shown in FIG. 3A, the first reset transistor T1 includes a gate, a first electrode and a second electrode T12. The gate of the first reset transistor T1 is electrically connected to a first reset signal line Reset1, the first electrode of the first reset transistor T1 is electrically connected to an initialization signal line Vinit1, and the second electrode T12 of the first reset transistor T1 is electrically connected to a third node N3. The first reset transistor T1 is configured to reset a gate of the driving transistor T3 in response to a reset signal received at the first reset signal line Reset1.

For example, as shown in FIG. 3A, the compensation transistor T2 includes a gate, a first electrode T21 and a second electrode T22. The gate of the compensation transistor T2 is electrically connected to a second scan signal line Gate2, the first electrode T21 of the compensation transistor T2 is electrically connected to a first node N1, and the second electrode T22 of the compensation transistor T2 is electrically connected to the third node N3. The compensation transistor T2 is configured to reset the driving transistor T3 or perform threshold compensation on the driving transistor T3 in response to a scan signal received at the second scan signal line Gate2.

For example, as shown in FIG. 3A, the driving transistor T3 includes a gate T33, a first electrode and a second electrode T32. The gate T33 of the driving transistor T3 is electrically connected to the first node N1, the first electrode of the driving transistor T3 is electrically connected to a second node N2, and the second electrode T32 of the driving transistor T3 is electrically connected to the third node N3. The driving transistor T3 is configured to produce a driving current signal.

For example, as shown in FIG. 3A, the data writing transistor T4 includes a gate, a first electrode and a second electrode. The gate of the data writing transistor T4 is electrically connected to a first scan signal line Gate1, the first electrode of the data writing transistor T4 is electrically connected to a data signal line Data, and a second electrode of the data writing transistor T4 is electrically connected to the second node N2. The data writing transistor T4 is configured to transmit a data signal received at the data signal line Data to the driving transistor T3 in response to a scan signal received at the first scan signal line Gate1.

For example, as shown in FIG. 3A, the first light emission control transistor T5 includes a gate, a first electrode and a second electrode. The gate of the first light emission control transistor T5 is electrically connected to a light emission control signal line EM, the first electrode of the first light emission control transistor T5 is electrically connected to a power supply signal line ELVDD, and the second electrode of the first light emission control transistor T5 is electrically connected to the second node N2. The first light emission control transistor T5 is configured to transmit a power supply signal received at the power supply signal line ELVDD to the driving transistor T3 in response to a light emission control signal received at the light emission control signal line EM.

For example, as shown in FIG. 3A, the second light emission control transistor T6 includes a gate, a first electrode and a second electrode. The gate of the second light emission control transistor T6 is electrically connected to the light emission control signal line EM, the first electrode of the second light emission control transistor T6 is electrically connected to the third node N3, and the second electrode of the second light emission control transistor T6 is electrically connected to a fourth node N4. The second light emission control transistor T6 is configured to, in response to the light emission control signal received at the light emission control signal line EM, transmit the driving current signal to a light-emitting device L for driving the light-emitting device L to emit light.

For example, as shown in FIG. 3A, the second reset transistor T7 includes a gate, a first electrode and a second electrode. The gate of the second reset transistor T7 is electrically connected to a second reset signal line Reset2, the first electrode of the second reset transistor T7 is electrically connected to a second initialization signal line Vinit2, and the second electrode of the second reset transistor T7 is electrically connected to the fourth node N4. The second reset transistor T7 is configured to transmit an initialization signal received at the second initialization signal line Vinit2 to the light-emitting device L in response to a reset signal received at the second reset signal line Reset2, so as to reset the light-emitting device L.

For example, an anode of the light-emitting device L is electrically connected to the fourth node N4, and a cathode of the light-emitting device L is electrically connected to a reference voltage line ELVSS.

It will be understood that in the present disclosure, a first electrode of a transistor is one of a source and a drain of the transistor, and a second electrode thereof is the other of the source and the drain of the transistor. Since the source and the drain of the transistor may be symmetrical in structure, there may be no difference in structure between the source and the drain of the transistor. That is, the first electrode and the second electrode of the transistor in the embodiments of the present disclosure may be indistinguishable in structure. For example, in a case where the transistor is a P-type transistor, the first electrode of the transistor is the source, and the second electrode of the transistor is the drain. For example, in a case where the transistor is an N-type transistor, the first electrode of the transistor is the drain, and the second electrode of the transistor is the source.

In the circuit provided in the embodiments of the present disclosure, the node does not represent an actual component, but represents a junction of related electrical connections in a circuit diagram. That is, these nodes are nodes equivalent to the junctions of the related electrical connections in the circuit diagram.

Figure 4:
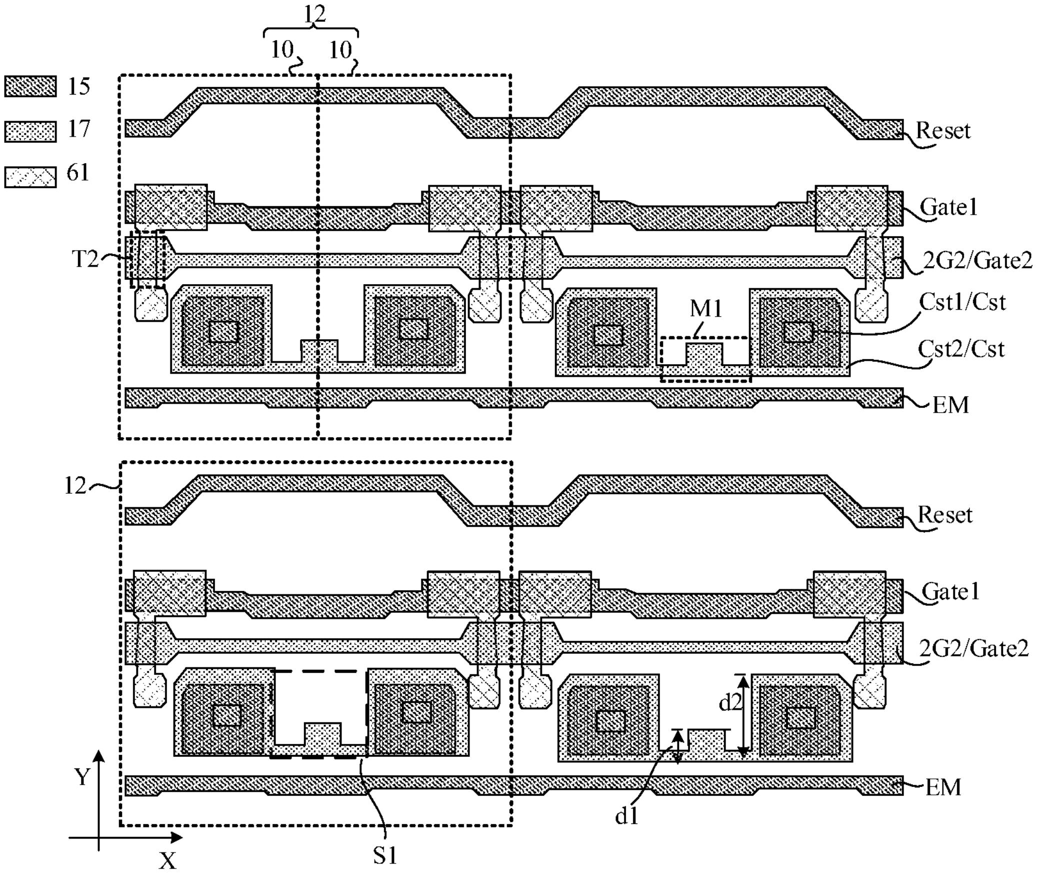
FIG. 4 is a structural diagram of a first conductive layer, a second conductive layer and a second semiconductor layer after superposition, in accordance with some embodiments of the present disclosure.

It will be noted that a plurality of pixel driving circuit groups 12 composed of the plurality of pixel driving circuits 10 are arranged in a plurality of rows in a second direction Y. A first reset signal line Reset1 connected to gates of first reset transistors T1 in the current row and a second reset signal line Reset2 connected to gates of second reset transistors T7 in the previous row may be the same reset signal line Reset (as shown in FIG. 4). That is, when the reset signal line Reset is turned on, the reset signal line Reset simultaneously transmits a reset signal to the first reset transistors T1 in the current row and the second reset transistors T7 in the previous row.

For example, as shown in FIG. 3A, the pixel driving circuit 10 further includes a capacitor Cst. The capacitor Cst includes a first electrode plate Cst1 and a second electrode plate Cst2. The first electrode plate Cst1 of the capacitor Cst is electrically connected to the first node N1, and the second electrode plate Cst2 of the capacitor Cst is electrically connected to the power supply signal line ELVDD.

In some embodiments, the pixel driving circuit 10 uses a low-temperature polycrystalline oxide (LTPO) circuit, that is, one pixel driving circuit 10 includes both low-temperature polysilicon (LTPS) thin film transistor(s) and oxide thin film transistor(s). The low-temperature polysilicon thin film transistor has strong load capacity, and the oxide thin film transistor has small off-state current and stronger charge retention capability than the low-temperature polysilicon thin film transistor. In this way, the pixel driving circuit 10 may achieve high charge mobility and good stability.

For example, the compensation transistor T2 may use an oxide thin film transistor and is an N-type transistor, that is, it is turned on at a high level. The first reset transistor T1, the driving transistor T3, the data writing transistor T4, the first light emission control transistor T5, the second light emission control transistor T6 and the second reset transistor T7 are all low-temperature polysilicon thin film transistors and are all P-type transistors, which are turned on at low levels. Using an oxide thin film transistor as the compensation transistor T2 may effectively prevent the first node N1 from electric leakage.

For example, the first reset transistor T1, the driving transistor T3, the data writing transistor T4, the first light emission control transistor T5, the second light emission control transistor T6, the second reset transistor T7 and the capacitor Cst are formed in the first semiconductor layer 13, the first conductive layer 15 and the second conductive layer 17. The compensation transistor T2 is formed in the second semiconductor layer 61 and the third conductive layer 62.

It will be noted that the above examples of the first reset transistor T1, the compensation transistor T2, the driving transistor T3, the data writing transistor T4, the first light emission control transistor T5, the second light emission control transistor T6 and the second reset transistor T7 do not form limitations on the transistor types.

Figure 3B:
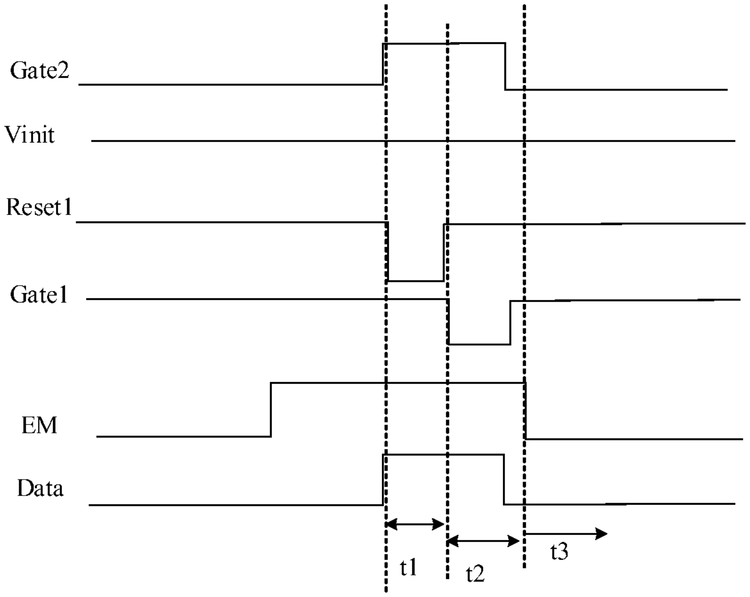
FIG. 3B is a timing diagram of a pixel driving circuit, in accordance with some embodiments of the present disclosure.

For example, the timing diagram of the pixel driving circuit 10 is shown in FIG. 3B. The timing includes three phases: an initialization phase t1, a data writing and Vth compensation phase t2 and an emission phase t3.

In the initialization phase t1: the reset signal provided by the first reset signal line Reset1 is at the low level, and the light emission control signal provided by the light emission control signal line EM and the scan signal provided by the second scan signal line Gate2 are at high levels. The first reset transistor T1 and the compensation transistor T2 are turned on, the first light emission control transistor T5 and the second light emission control transistor T6 are turned off, and the voltage from a first initialization signal line Vinit1 is written into the first node N1 through the first reset transistor T1 and the compensation transistor T2, so as to initialize the first node N1.

In the data writing and Vth compensation phase t2, the reset signal provided by the first reset signal line Reset1 is at a high level, and the signal transmitted by the first initialization signal line Vinit1 is turned off. The scan signal provided by the first scan signal line Gate1 is at a low level, and the data signal from the data signal line Data is written into the first node N1 through the data writing transistor T4, the driving transistor T3 and the compensation transistor T2 to perform Vth compensation on the driving transistor T3.

In the emission phase t3, the scan signal provided by the second scan signal line Gate2 is at a low level, and the light emission control signal provided by the emission control signal line EM is at a low level. The compensation transistor T2 is turned off, and the first light emission control transistor T5 and the second light emission control transistor T6 are turned on to enter the emission phase.

As shown in FIG. 2, a plurality of light-emitting devices L are formed in the light-emitting device stack layer 2. The plurality of light-emitting devices L are disposed on the plurality of pixel driving circuits 10 in the array substrate 1. The array substrate 1 is used to drive the plurality of light-emitting devices L to emit light. The light-emitting device stack layer 2 includes an anode layer 202, a pixel defining layer 201, a light-emitting functional layer 203 and a cathode layer 204 that are sequentially disposed on a side of the pixel circuit stack layer 30 away from the substrate 101.

In some embodiments, the mobile phone 1000 further includes camera(s), various sensors, a speaker and other components.

In order to achieve full-screen display, photosensitive component(s) need to be integrated under the display panel 100 and the photosensitive component(s) receive light from the front of the display panel 100. The photosensitive component is, for example, a camera; and accordingly, this technology is an under-screen camera technology. The photosensitive component is, for example, a fingerprint sensor; and accordingly, this technology is under-screen fingerprint recognition technology. The implementation of the under-screen camera technology and the under-screen fingerprint recognition technology has certain requirements for light transmittance of a display screen. However, in the display screen, provision of all film layers used for forming the pixel driving circuit 10 affects the light transmittance of the screen, thereby affecting a shooting effect and a fingerprint recognition effect of the display screen.

In light of the above problems, as shown in FIGS. 2 and 4, some embodiments of the present disclosure provide an array substrate 1. The array substrate 1 includes a substrate 101 and a plurality of pixel driving circuit groups 12 disposed on the substrate 101. The plurality of pixel driving circuit groups 12 are arranged in an array in a first direction X and a second direction Y. Each pixel driving circuit group 12 in the plurality of pixel driving circuit groups 12 includes two pixel driving circuits 10 arranged in the first direction X.

The first direction X intersects the second direction Y, and the first direction X and the second direction Y are both parallel to an upper surface of the substrate 101. For example, the first direction X is perpendicular to the second direction Y, the first direction X is a row direction in which the plurality of pixel driving circuit groups 12 are arranged, and the second direction Y is a column direction in which the plurality of pixel driving circuit groups 12 are arranged.

Figure 12:
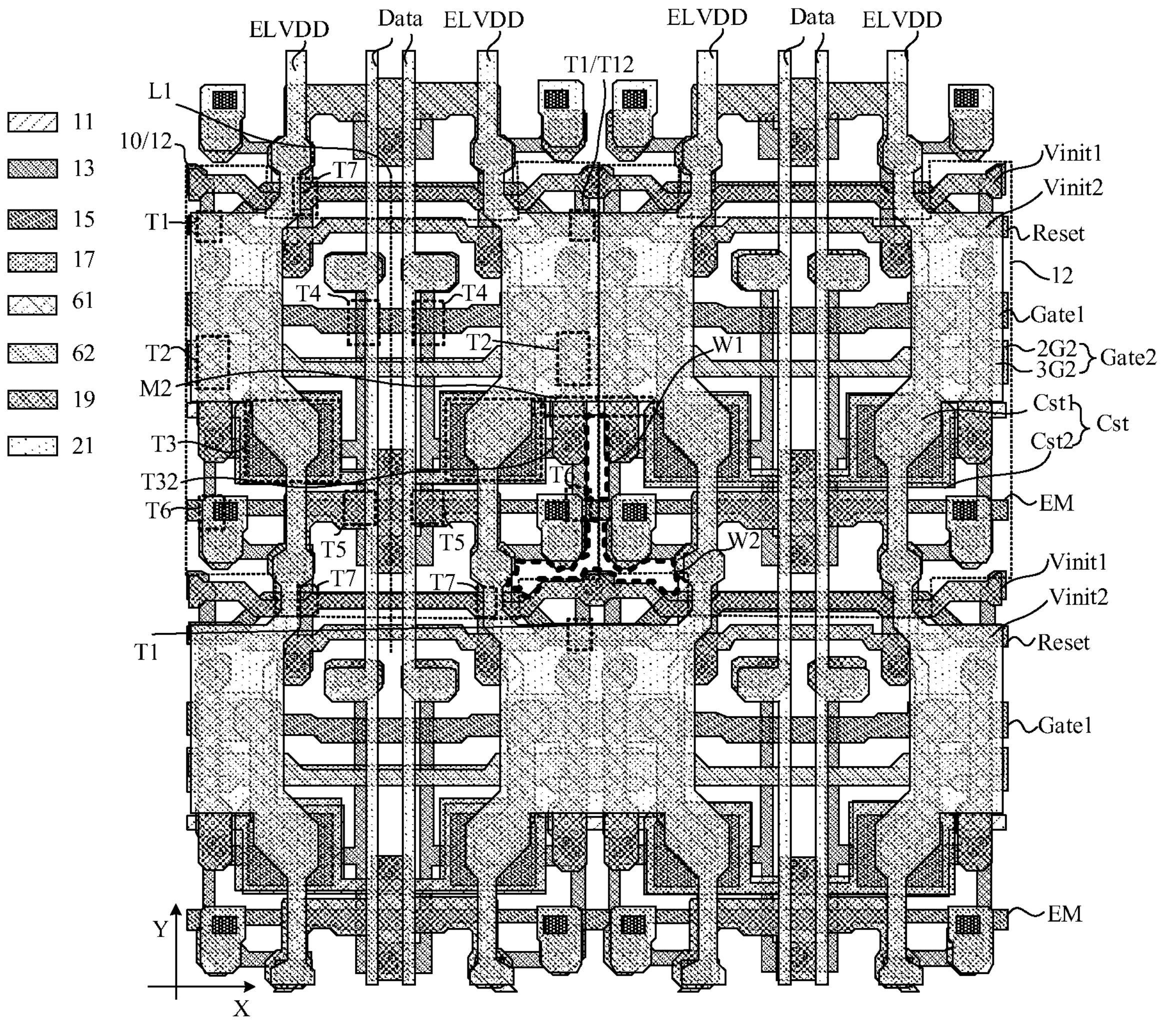
FIG. 12 is a structural diagram of a shielding layer, a first semiconductor layer, a first conductive layer, a second conductive layer, a second semiconductor layer, a third conductive layer, a fourth conductive layer and a fifth conductive layer after superposition, in accordance with some embodiments of the present disclosure.

For example, as shown in FIG. 12, the two pixel driving circuits 10 are provided as one pixel driving circuit group 12, so that two data signal lines Data of the pixel driving circuit group 12 may be arranged adjacently in the first direction X, and two power supply signal lines ELVDD of the pixel driving circuit group 12 may be arranged on both sides of the two data signal lines Data. That is, in one pixel driving circuit group 12, a power supply signal line ELVDD, a data signal line Data, a data signal line Data and a power supply signal line ELVDD are arranged sequentially in the first direction X. Based on this provision, in two adjacent pixel driving circuit groups 12, two adjacent power supply signal lines ELVDD may be connected, so as to reduce a voltage drop of the power supply signal line ELVDD.

As shown in FIGS. 2 and 4, the array substrate 1 provided in the embodiment of the present disclosure further includes a first conductive layer 15 provided on a side of the substrate 101 (shown in FIG. 2), and a second conductive layer 17 on a side of the first conductive layer 15 away from the substrate 101. The array substrate 1 further includes power supply signal lines ELVDD (shown in FIG. 12).

As shown in FIG. 4, the pixel driving circuit 10 includes driving transistors T3 and capacitors Cst. The capacitor Cst includes a first electrode plate Cst1 and a second electrode plate Cst2. The first electrode plate Cst1 is connected to a gate of a driving transistor T3, and the second electrode plate Cst2 is connected to a power supply signal line ELVDD. As shown in FIG. 4, the first electrode plate Cst1 is located in the first conductive layer 15, and the second electrode plate Cst2 is located in the second conductive layer 17.

For example, the first electrode plate Cst1 and the gate of the driving transistor T3 have an integrated structure.

Since the second electrode plate Cst2 of the capacitor Cst of each pixel driving circuit 10 needs to be connected to the power supply signal line ELVDD, multiple second electrode plates Cst2 of multiple capacitors Cst may be connected, so as to reduce a voltage drop in a power supply signal provided by the power supply signal line ELVDD during transmission.

Based on this, a first connection pattern M1 is connected between the second electrode plates Cst2 of the two pixel driving circuits 10 in the pixel driving circuit group 12, and the first connection pattern M1 is located in the second conductive layer 17. That is, the two adjacent second electrode plates Cst2 are connected by the first connection pattern M1.

A dimension d1 of the first connection pattern M1 in the second direction Y is less than a dimension d2 of the second electrode plate Cst2 in the second direction Y.

It will be noted that the dimension d1 of the first connection pattern M1 in the second direction Y refers to a maximum dimension of the first connection pattern M1 in the second direction Y, and the dimension d2 of the second electrode plate Cst2 in the second direction Y refers to a maximum dimension of the second electrode plate Cst2 in the second direction Y.

For example, the first connection pattern M1 is connected to the second electrode plate Cst2 of the two pixel driving circuits 10 in the pixel driving circuit group 12. The first connection pattern M1 and the second electrode plate Cst2 of the two pixel driving circuits 10 in the pixel driving circuit group 12 have an integrated structure, which may simplify the structure and the manufacturing process of the array substrate 1.

For example, as shown in FIG. 4, in a pixel driving circuit group 12, the second electrode plates Cst2 of the two pixel driving circuits 10 are connected by the first connection pattern M1, and the two pixel driving circuits 10 may receive the same power supply signal. Since the first connection pattern M1 plays a role of transmitting the power supply signal in the pixel driving circuit group 12, the setting of the dimension d1 of the first connection pattern M1 in the second direction Y being less than the dimension d2 of the second electrode plate Cst2 in the second direction Y may not affect the transmission of the power supply signal. Thus, the dimension d1 of the first connection pattern M1 in the second direction Y is set to be less than the dimension d2 of the second electrode plate Cst2 in the second direction Y. Such setting may increase light transmittance of a region S1 between the two second electrode plates Cst2 in the pixel driving circuit group 12.

In the embodiments of the present disclosure, the dimension d1 of the first connection pattern M1 in the second direction Y is set to be less than the dimension d2 of the second electrode plate Cst2 in the second direction Y, and thus the transmittance of the region S1 between the two second electrode plates Cst2 in the pixel driving circuit group 12 may be improved, thereby improving the light transmittance of the array substrate 1.

In some embodiments, as shown in FIG. 4, a ratio of the dimension d1 of the first connection pattern M1 in the second direction Y to the dimension d2 of the second electrode plate Cst2 in the second direction Y is in a range of 10% to 50%, inclusive.

For example, the ratio of the dimension d1 of the first connection pattern M1 in the second direction Y to the dimension d2 of the second electrode plate Cst2 in the second direction Y is 10%, 15%, 25%, 30%, 40% or 50%, which is not limited here.

The ratio of the dimension d1 of the first connection pattern M1 in the second direction Y to the dimension d2 of the second electrode plate Cst2 in the second direction Y is set to be in the range of 10% to 50%, inclusive. The first connection pattern M1 may not only meet the function of connecting the second electrode plates Cst2 of the two pixel driving circuits 10 in one pixel driving circuit group 12 to transmit the power supply signal, but also improve the light transmittance of the array substrate 1.

In some examples, as shown in FIG. 4, the dimension d1 of the first connection pattern M1 in the second direction Y is in a range of 2.0 μm to 5.5 μm, inclusive.

For example, as shown in FIG. 4, the dimension d1 of the first connection pattern M1 in the second direction Y is 2.0 μm, 3.5 μm, 4.0 μm, 5.0 μm or 5.5 μm, which is not limited here.

For example, the dimension d1 of the first connection pattern M1 shown in FIG. 4 in the second direction Y is less than the dimension d2 of the second electrode plate Cst2 in the second direction Y. For example, d1 is equal to 5.5 μm (i.e., d1=5.5 μm), and d2 is equal to 13.5 μm (i.e., d2=13.5 μm). In some other examples, the dimension d1 of the first connection pattern M1 in the second direction Y is equal to the dimension d2 of the second electrode plate Cst2 in the second direction Y. For example, d1 is equal to d2, and d2 is equal to 13.5 μm (i.e., d1=d2=13.5 μm). In the array substrate 1, the light transmittance of the array substrate 1 may increase by about 1.5% due to the provision of the region S1.

In some embodiments, as shown in FIGS. 2, 5 and 7A to 7E, the array substrate 1 includes a shielding layer 11 disposed between the substrate 101 and the first conductive layer 15. As shown in FIGS. 6 and 7A to 7E, the shielding layer 11 includes a plurality of shielding patterns 111.

Figure 6:
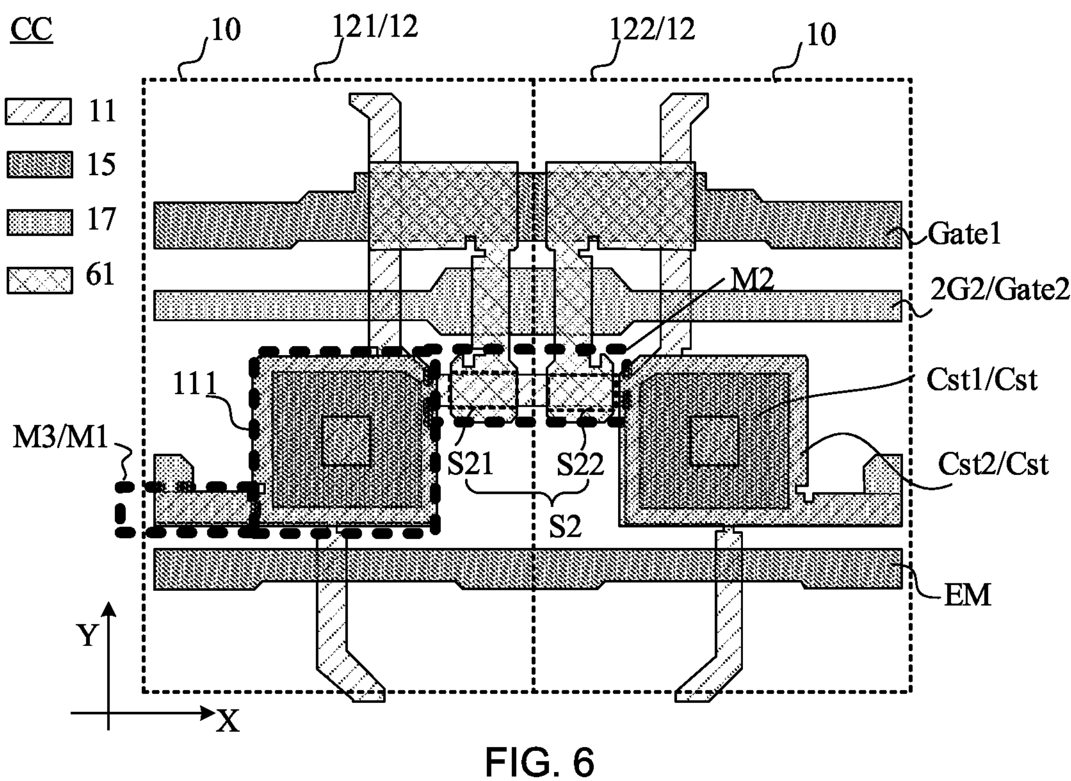
FIG. 6 is a structural diagram of a shielding layer, a first conductive layer, a second conductive layer and a second semiconductor layer after superposition based on the CC position of an array substrate provided in FIG. 5.

The provision of the shielding layer 11 may prevent light from a side of the substrate 101 away from the shielding layer 11 from affecting the pixel driving circuit 10. As shown in FIG. 6, the pixel driving circuit includes a shielding pattern 111. Each shielding pattern 111 is overlapped with both a first electrode plate Cst1 and a second electrode plate Cst2 of a capacitor Cst. The first electrode plate Cst1 and the gate of the driving transistor T3 have an integrated structure, that is, the shielding pattern 111 is overlapped with the gate of the driving transistor T3. The shielding pattern 111 may avoid the influence of the light from the side of the substrate 101 away from the shielding pattern 111 on the pixel driving circuit 10 (e.g., the driving transistor T3).

For example, shielding patterns 111 of all pixel driving circuits 10 are connected in the first direction X and the second direction Y to form a network structure, and the shielding patterns 111 are electrically connected to the reference voltage line ELVSS. As shown in FIG. 2, the cathode layer 204 is used to transmit a reference voltage signal, and the shielding patterns 111 being electrically connected to the reference voltage line ELVSS means that the shielding patterns 111 are connected to the cathode layer 204. Thus, the resistance of the cathode layer 204 may be reduced, thereby reducing a voltage drop of the reference voltage line ELVSS.

In the first direction X, a second connection pattern M2 is connected between shielding patterns 111 of two adjacent pixel driving circuits 10 between at least two adjacent pixel driving circuit groups 12. The second connection pattern M2 is located in the shielding layer 11. For example, the second connection pattern M2 and the shielding patterns 111 have an integrated structure, which may simplify the structure and the manufacturing process of the array substrate 1.

As shown in FIGS. 2, 4, 5 and 6, the array substrate 1 further includes a second semiconductor layer 61, and the second semiconductor layer 61 is located on a side of the second conductive layer 17 away from the substrate 101. An orthographic projection of the second connection pattern M2 on the substrate 101 is overlapped with an orthographic projection of the second semiconductor layer 61 on the substrate 101. The second semiconductor layer 61 includes an active layer pattern of the compensation transistor T2.

In some examples, as shown in FIG. 6, in the first direction X, a pixel driving circuit group 12 located at the left is referred to as a first pixel driving circuit group 121, and a pixel driving circuit group 12 located at the right is referred to as a second pixel driving circuit group 122. A portion of the shielding layer 11 connected between the first pixel driving circuit group 121 and the second pixel driving circuit group 122 is the second connection pattern M2, which is used to transmit a fixed voltage signal, for example, the fixed voltage signal is the reference voltage signal.

The orthographic projection of the second connection pattern M2 on the substrate 101 is overlapped with the orthographic projection of the second semiconductor layer 61 on the substrate 101. That is, the second connection pattern M2 is disposed between the second semiconductor layer 61 and the substrate 101, so that a light blocking region of the second semiconductor layer 61 is partially overlapped with a light blocking region of the second connection pattern M2, thereby reducing the light blocking of the second connection pattern M2 and improving the light transmittance of the array substrate 1.

In some embodiments, as shown in FIG. 6, in the first direction X, between two adjacent pixel driving circuit groups 12, an overlapping area S2 of the orthographic projection of the second connection pattern M2 on the substrate 101 and the orthographic projection of the second semiconductor layer 61 on the substrate 101 is in a range of 20 $\mu m^2$ to 30 $\mu m^2$, inclusive.

For example, as shown in FIGS. 2 and 6, in the pixel driving circuit 10 of the first pixel driving circuit group 121, an overlapping area of the orthographic projection of the second connection pattern M2 on the substrate 101 and the orthographic projection of the second semiconductor layer 61 on the substrate 101 is denoted as an area S21. In the pixel driving circuit 10 of the second pixel driving circuit group 122, an overlapping area of the orthographic projection of the second connection pattern M2 on the substrate 101 and the orthographic projection of the second semiconductor layer 61 on the substrate 101 is denoted as an area S22. The overlapping area S2 is a sum of the area S21 and the area S22 (i.e., S2=S21+S22).

For example, in the first direction X, between two adjacent pixel driving circuit groups 12, the overlapping area S2 of the orthographic projection of the second connection pattern M2 on the substrate 101 and the orthographic projection of the second semiconductor layer 61 on the substrate 101 is 20 $\mu m^2$, 21 $\mu m^2$, 23 $\mu m^2$, 25 $\mu m^2$, 27 $\mu m^2$, 29 $\mu m^2$, or 30 $\mu m^2$, which is not limited here.

For example, as shown in FIG. 6, the orthographic projection of the second connection pattern M2 on the substrate 101 is provided to be overlapped with an orthographic projection of the second semiconductor layer 61 on the substrate 101, so that the light transmittance of the array substrate 1 may increase by about 0.57%.

In some embodiments, by providing different connection manners of the shielding patterns 111 in the first direction X and the second direction Y, the light transmittance of the array substrate 1 may be improved.

Figure 7A:
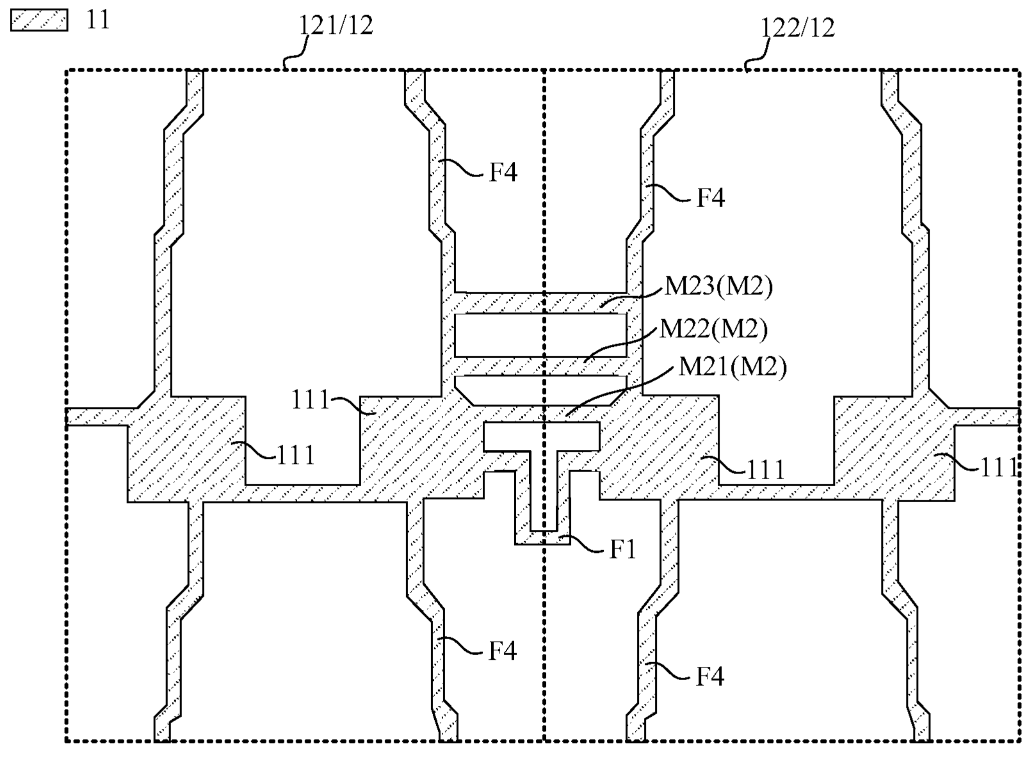
FIG. 7A is a structural diagram of a shielding layer, in accordance with some embodiments of the present disclosure.

As shown in FIG. 7A, the plurality of shielding patterns 111 are connected in the first direction X and the second direction Y to form a network structure. Between two adjacent pixel driving circuit groups 12, the connection pattern(s) (called lateral connection pattern(s)) between adjacent shielding patterns 111 in the first direction X include one or more of second connection patterns M2 (including M21, M22, and M23) and a fourth connection pattern F1. For the convenience of illustration, all the lateral connection patterns are shown in FIG. 7A. The connection patterns between adjacent shielding patterns 111 in the second direction Y are called longitudinal connection patterns F4. The longitudinal connection pattern F4 is in a strip shape and extends in the second direction as a whole, and is used for connecting two shielding patterns 111 located at both ends thereof.

Figure 7B:
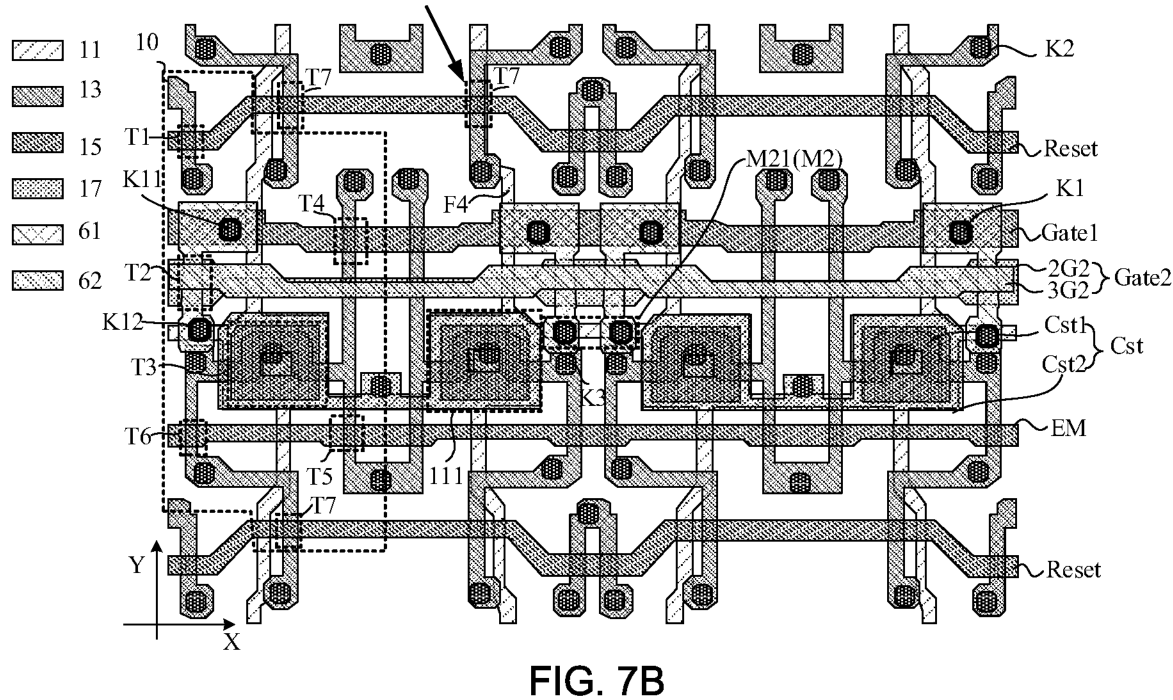
FIG. 7B is a structural diagram of a shielding layer, a first semiconductor layer, a first conductive layer, a second conductive layer, a second semiconductor layer and a third conductive layer after superposition, in accordance with some embodiments of the present disclosure.

For example, as shown in FIGS. 7A and 7B, the lateral connection pattern(s) include a first second connection pattern M21, and an orthographic projection of the first second connection pattern M21 on the substrate 101 is overlapped with the orthographic projection of the second semiconductor layer 61 on the substrate 101. Specifically, the orthographic projection of the first second connection pattern M21 on the substrate 101 is overlapped with an end of the active layer pattern of the compensation transistor T2.

Figure 7C:
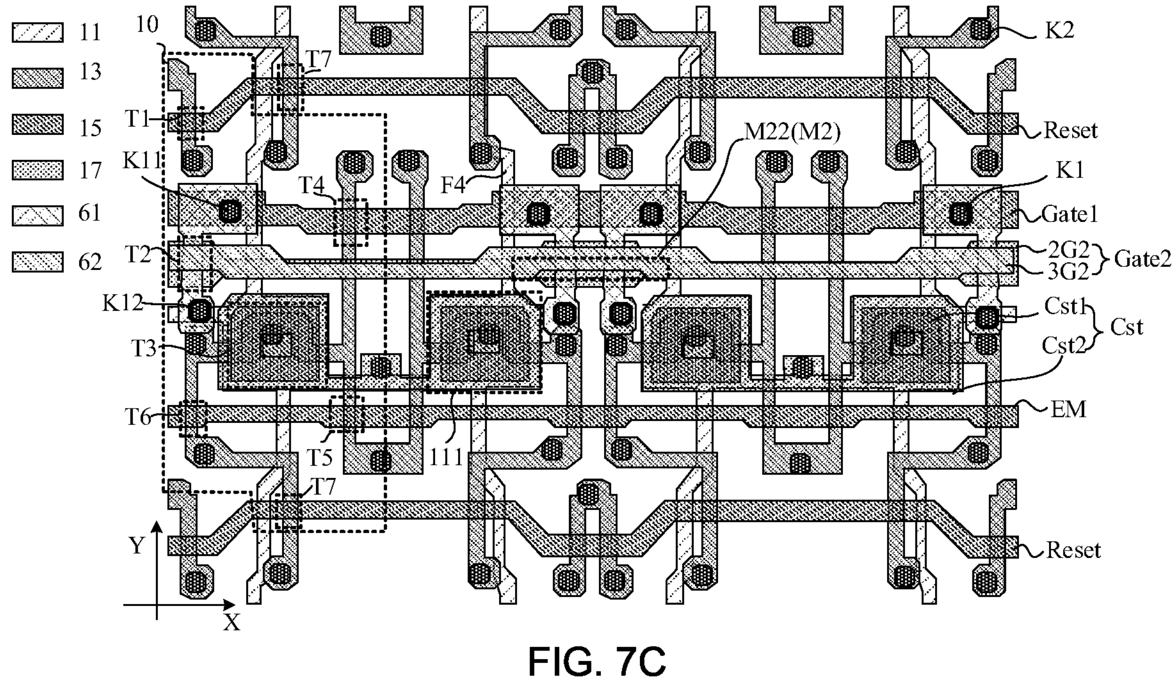
FIG. 7C is another structural diagram of a shielding layer, a first semiconductor layer, a first conductive layer, a second conductive layer, a second semiconductor layer and a third conductive layer after superposition, in accordance with some embodiments of the present disclosure.

For example, as shown in FIGS. 7A and 7C, the lateral connection pattern(s) include a second second connection pattern M22, and an orthographic projection of the second second connection pattern M22 on the substrate 101 is overlapped with the orthographic projection of the second semiconductor layer 61 on the substrate 101. Specifically, the orthographic projection of the second second connection pattern M22 on the substrate 101 is overlapped with a middle of the active layer pattern of the compensation transistor T2. In addition, the orthographic projection of the second second connection pattern M22 on the substrate 101 is overlapped with an orthographic projection of the second scan signal line Gate2 on the substrate 101. The second scan signal line Gate2 includes a first scan signal sub-line 2G2 located in the second conductive layer 17 and a second scan signal sub-line 3G2 located in the third conductive layer 62. The first scan signal sub-line 2G2 and the second scan signal sub-line 3G2 are connected to form the second scan signal line Gate2.

Figure 7D:
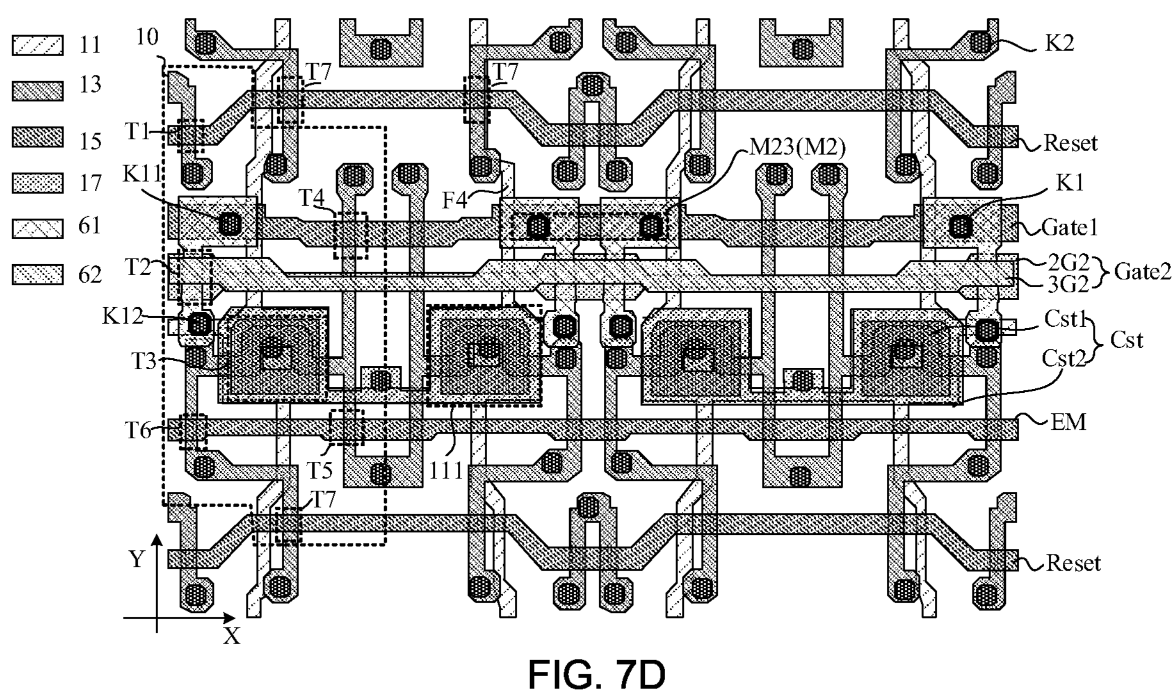
FIG. 7D is yet another structural diagram of a shielding layer, a first semiconductor layer, a first conductive layer, a second conductive layer, a second semiconductor layer and a third conductive layer after superposition, in accordance with some embodiments of the present disclosure.

For example, as shown in FIGS. 7A and 7D, the lateral connection pattern(s) include a third second connection pattern M23, and an orthographic projection of the third second connection pattern M23 on the substrate 101 is overlapped with the orthographic projection of the second semiconductor layer 61 on the substrate 101. Specifically, the orthographic projection of the third second connection pattern M23 on the substrate 101 is overlapped with another end of the active layer pattern of the compensation transistor T2. In addition, the orthographic projection of the third second connection pattern M23 on the substrate 101 is also overlapped with an orthographic projection of the first scan signal line Gate1 on the substrate 101. The first scan signal line Gate1 is located in the first conductive layer 15.

Figure 7E:
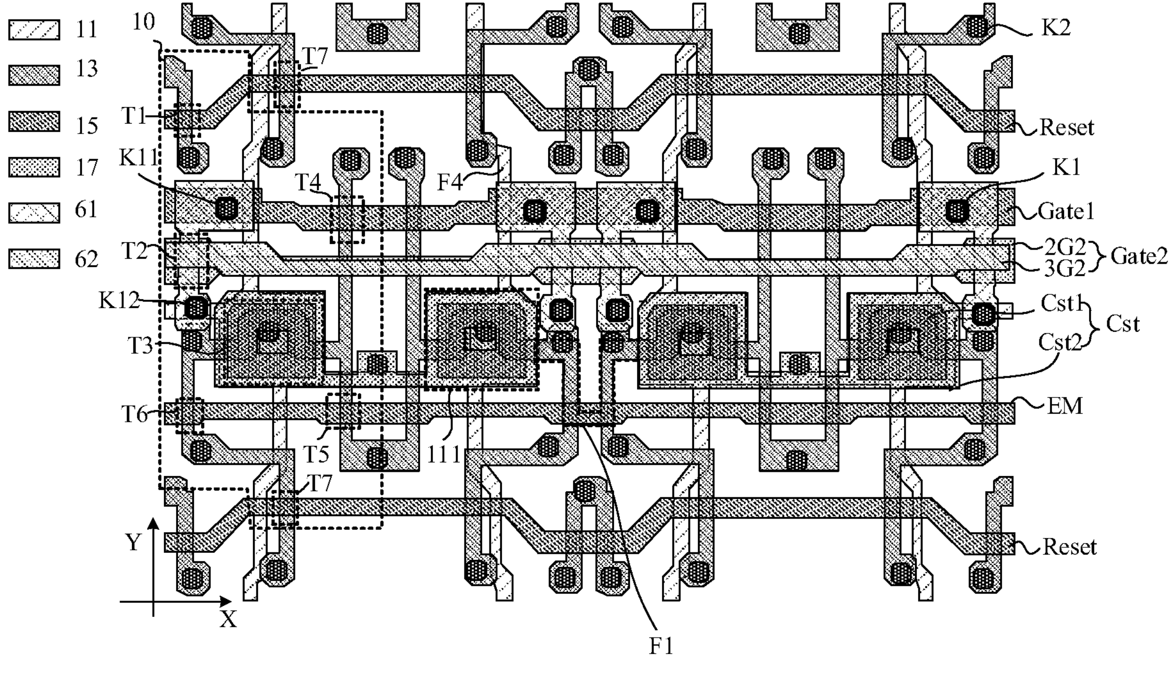
FIG. 7E is yet another structural diagram of a shielding layer, a first semiconductor layer, a first conductive layer, a second conductive layer, a second semiconductor layer and a third conductive layer after superposition, in accordance with some embodiments of the present disclosure.

For example, as shown in FIGS. 7A and 7E, the lateral connection pattern(s) include a fourth connection pattern F1, and an orthographic projection of the fourth connection pattern F1 on the substrate 101 is overlapped with an orthographic projection of the first semiconductor layer 13 on the substrate 101 and an orthographic projection of the light emission control signal line EM on the substrate 101. The light emission control signal line EM is located in the first conductive layer 15.

For example, as shown in FIGS. 7A and 7B, the longitudinal connection pattern F4 is overlapped with the first semiconductor layer 13. Specifically, referring to the position of the arrow in FIG. 7B, a portion of the longitudinal connection pattern F4 is overlapped with an active layer pattern, in the first semiconductor layer 13, of the second reset transistor T7.

Through the above provision, both the lateral connection pattern(s) and the longitudinal connection patterns in the shielding layer 11 are overlapped with patterns in other film layers, so that the lateral connection pattern(s) and the longitudinal connection patterns do not need to occupy additional space, and thus the light transmission of the array substrate 1 may be improved.

In some embodiments, as shown in FIG. 2, a third gate dielectric layer 106 and a third insulating layer 107 are provided on a side of the second semiconductor layer 61 away from the substrate 101.

As shown in FIG. 7B, the third gate dielectric layer 106 and the third insulating layer 107 include at least one first via hole K1.

Figure 9:
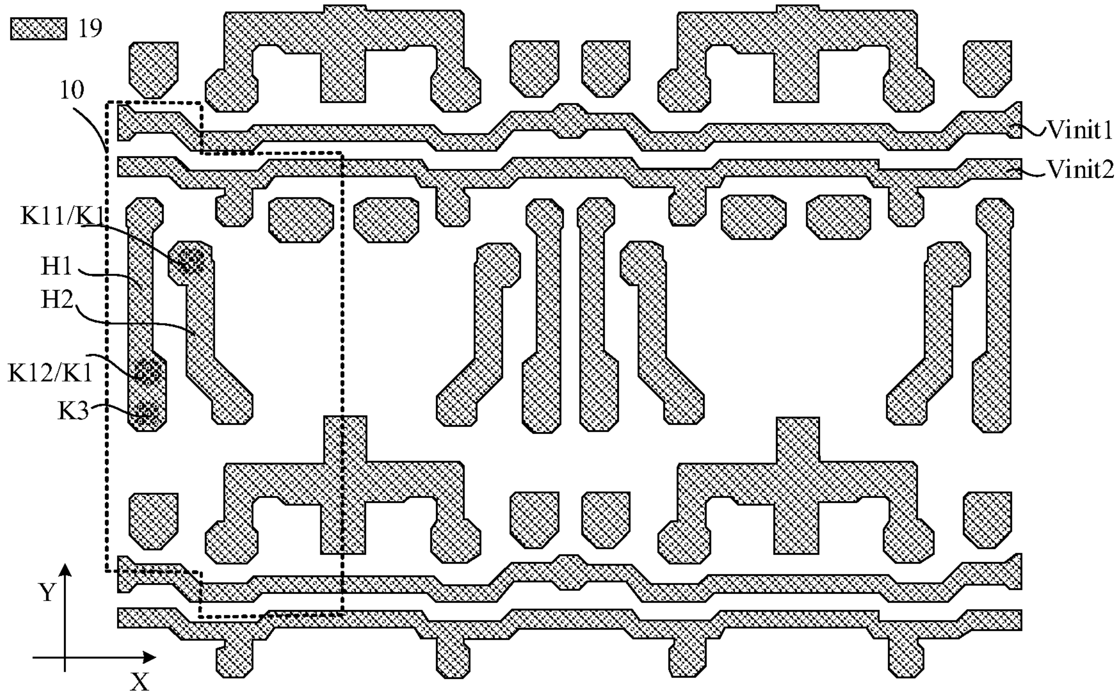
FIG. 9 is a structural diagram of a fourth conductive layer, in accordance with some embodiments of the present disclosure.
Figure 10:
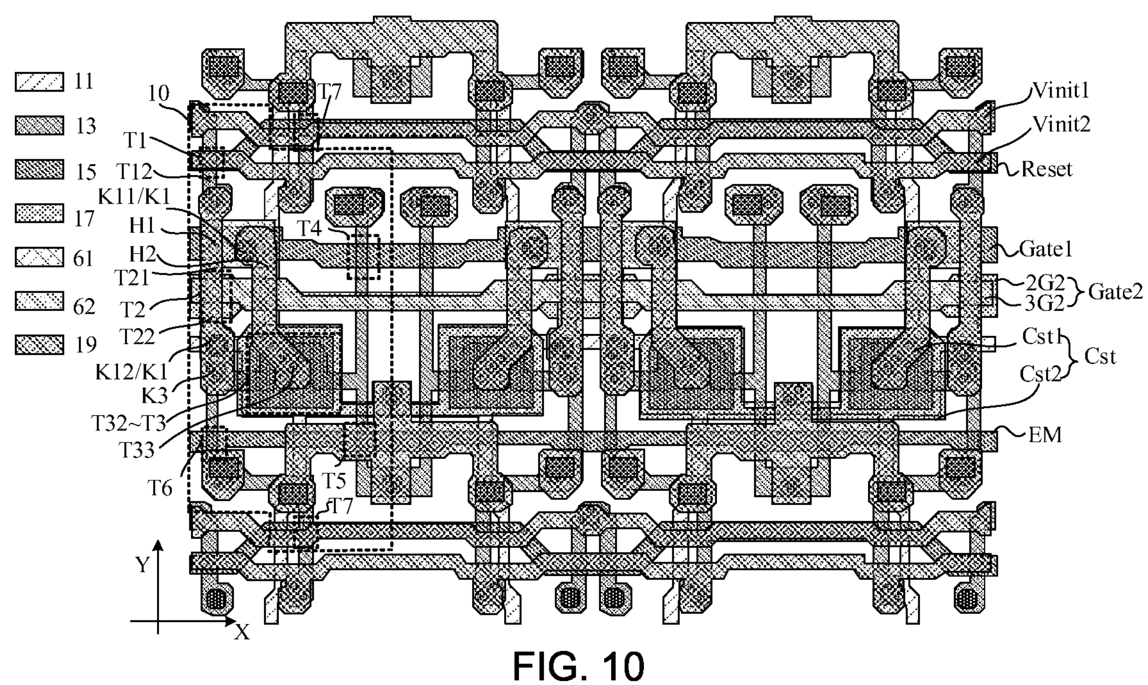
FIG. 10 is a structural diagram of a shielding layer, a first semiconductor layer, a first conductive layer, a second conductive layer, a second semiconductor layer, a third conductive layer and a fourth conductive layer after superposition, in accordance with some embodiments of the present disclosure.

For example, as shown in FIG. 7B, the function of the first via hole K1 is to achieve connection between the compensation transistor T2 and the first reset transistor T1 and the driving transistor T3. For example, as shown in FIGS. 9 and 10, the array substrate 1 has a fourth conductive layer 19, and the fourth conductive layer 19 includes first patterns H1 and second patterns H2. The pixel driving circuit 10 has two first via holes K1, which are denoted as a No. 1 via hole K11 and a No. 2 via hole K12. As shown in FIG. 10, an end of the first pattern H1 is connected to the second electrode T12 of the first reset transistor T1, and the other end of the first pattern H1 is connected to the second electrode T32 of the driving transistor T3 and the second electrode T22 of the compensation transistor T2 through the No. 2 via hole K12. An end of the second pattern H2 is connected to the first electrode T21 of the compensation transistor T2 through the No. 1 via hole K11, and the other end of the second pattern H2 is connected to the gate T33 of the driving transistor T3.

For example, the at least one first via hole extends through the third gate dielectric layer 106 (shown in FIG. 2) and the third insulating layer 107 (shown in FIG. 2) to the second semiconductor layer 61. An orthogonal projection of the at least one first via hole K1 on the substrate 101 is overlapped with the orthographic projection of the second connection pattern M2 on the substrate 101.

Figure 8:
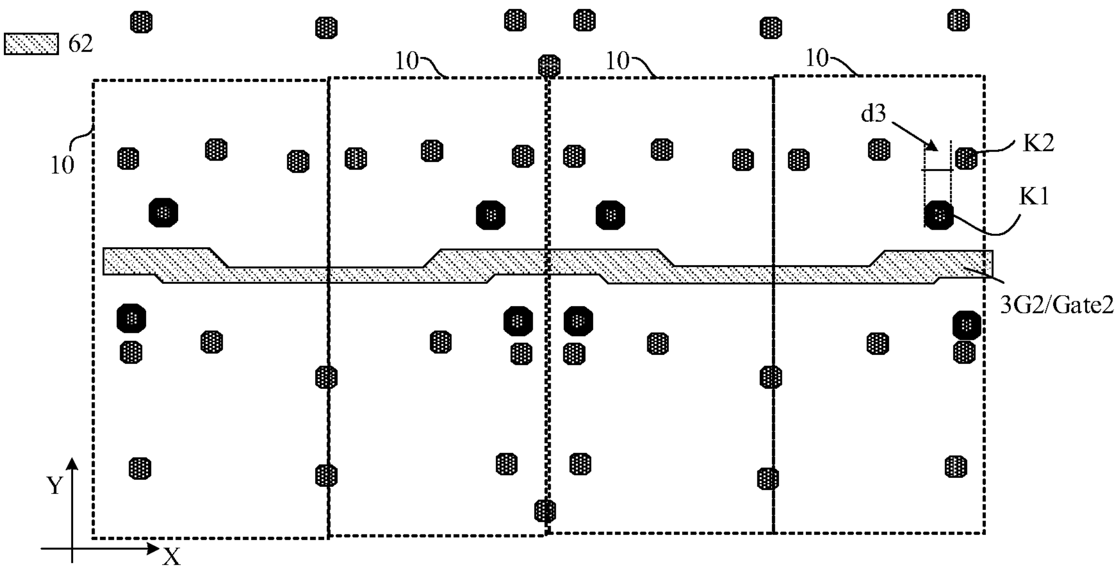
FIG. 8 is a structural diagram of a third conductive layer, in accordance with some embodiments of the present disclosure.

For example, as shown in FIG. 8, a size d3 of a first via hole K1 is greater than or equal to 2.5 μm, and less than or equal to 3 μm.

It will be noted that in order to clearly show the positions of the first via hole(s) K1, the third gate dielectric layer 106 and the third insulating layer 107 are not shown in FIGS. 7B and 8. The provision of the third gate dielectric layer 106 and the third insulating layer 107 may refer to FIG. 2.

For example, as shown in FIG. 8, the first via hole K1 is square, and the size d3 of the first via hole K1 may be a width of the first via hole K1. Alternatively, the first via hole K1 is circular, and the size d3 of the first via hole K1 may be a diameter of the first via hole K1. For example, the size d3 of the first via hole K1 is 2.6 μm, 2.7 μm, 2.8 μm, 2.9 μm, or 3 μm, which is not limited here.

As shown in FIG. 7B, since the second semiconductor layer 61 and the second connection pattern M2 are overlapped, a surface of a region of the second semiconductor layer 61 covered by the third insulating layer 107 is relatively high, that is, the surface of the region is relatively far away from the substrate 101. When forming via hole(s) extending through the third gate dielectric layer 106 and the third insulating layer 107, the first via hole(s) K1 formed in this region may be made relatively large. For example, as shown in FIG. 8, the via hole(s) extending through the third insulating layer 107 further include a plurality of second via holes K2. Orthogonal projections of the second via holes K2 on the substrate 101 are not overlapped with the orthographic projection of the second semiconductor layer 61 on the substrate 101. A size of the second via K2 is generally less than or equal to 2.5 μm.

The relatively large size of the first via hole K1 (the No. 1 via hole K11 and the No. 2 via hole K12) may increase a contact area of two conductive patterns connected through the first via hole K1, thereby reducing the contact resistance.

Figure 5:
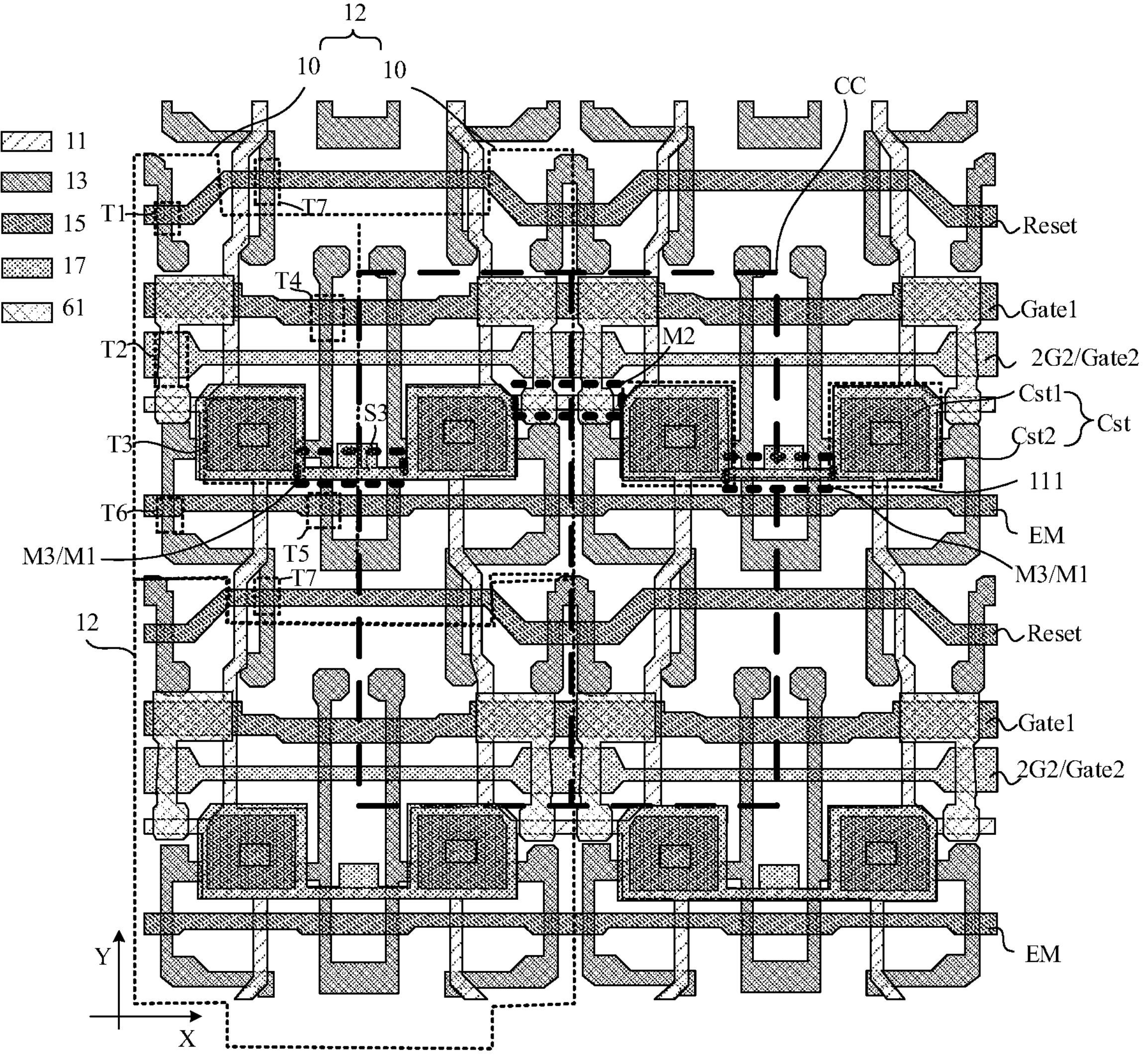
FIG. 5 is a structural diagram of a shielding layer, a first semiconductor layer, a first conductive layer, a second conductive layer and a second semiconductor layer after superposition, in accordance with some embodiments of the present disclosure.

In some embodiments, as shown in FIGS. 2, 5 and 6, the array substrate 1 includes a shielding layer 11 disposed between the substrate 101 and the first conductive layer 15.

For example, the provision of the shielding layer 11 may prevent light from a side of the substrate 101 away from the shielding layer 11 from affecting the pixel driving circuit 10, and may reduce a voltage drop of a signal line. For details, reference may be made to the above introduction, which will not be repeated here.

It can be seen from the above that shielding patterns 111 of all pixel driving circuits 10 are connected in the first direction X and the second direction Y to form a network structure. As shown in FIG. 12, in the pixel driving circuit group 12, two pixel driving circuits 10 are symmetrically arranged in the second direction Y.

For example, as shown in FIG. 12, there is a center line L1 along the second direction Y in the pixel driving circuit group 12, and the transistors (including the first reset transistor T1, the compensation transistor T2, the driving transistor T3, the data writing transistor T4, the first light emission control transistor T5, the second light emission control transistor T6 and the second reset transistor T7) of the two pixel driving circuits 10 on both sides of the center line L1 are arranged symmetrically with respect to the center line L1. The array substrate 1 includes a fifth conductive layer 21. The fifth conductive layer 21 is provided with power supply signal lines ELVDD and data signal lines Data. Between two adjacent pixel driving circuit groups 12 in the first direction X, two adjacent pixel driving circuits 10 may share a power supply signal line ELVDD.

Based on the above symmetrical arrangement, between every two adjacent pixel driving circuit groups 12, shielding patterns 111 of two adjacent pixel driving circuits 10 are connected by a pattern, and the pattern is called the second connection pattern M2. In the pixel driving circuit group 12, shielding patterns 111 of the two pixel driving circuits 10 are connected by a pattern, and the pattern is called a third connection pattern M3.

For example, as shown in FIG. 5, in the pixel driving circuit group 12, the third connection pattern M3 is connected between the shielding patterns 111 of the two pixel driving circuits 10, and the third connection pattern M3 is located in the shielding layer 11.

For example, an orthographic projection of the second conductive layer 17 on the substrate 101 covers an orthographic projection of the third connection pattern M3 on the substrate 101.

For example, the third connection pattern M3 and the shielding patterns 111 have an integrated structure, which may simplify the structure and the manufacturing process of the array substrate 1.

For example, the third connection pattern M3 is used to transmit a fixed voltage signal, for example, the fixed voltage signal is a reference voltage signal.

In some embodiments, as shown in FIG. 5, in a case where the second conductive layer 17 includes the first connection pattern M1, an overlapping area of the orthographic projection of the first connection pattern M1 on the substrate 101 and an orthographic projection of the third connection pattern M3 on the substrate 101 is greater than 70% of the orthographic projection of the first connection pattern M1 on the substrate 101.

For example, as shown in FIG. 5, in the pixel driving circuit group 12, the first connection pattern M1 connects the second electrode plates Cst2 of the two pixel driving circuits 10. The shielding pattern 111 of the shielding layer 11 is provided on a side of the second electrode plate Cst2 proximate to the substrate 101, and the shielding pattern 111 may receive a fixed voltage signal, such as a reference voltage signal. The shielding pattern 111 may shield the influence of peripheral stray charges on the driving transistor T3. It can be understood that in the pixel driving circuit group 12, the third connection pattern M3 is used to connect the shielding patterns 111 of the two pixel driving circuits 10, so that the overlapping area of the orthographic projection of the first connection pattern M1 connecting the two second electrode plates Cst2 on the substrate 101 and the orthographic projection of the third connection pattern M3 on the substrate 101 may be set to be greater than 70% of the orthographic projection of the first connection pattern M1 on the substrate 101.

For example, the overlapping area of the orthographic projection of the first connection pattern M1 on the substrate 101 and an orthographic projection of the third connection pattern M3 on the substrate 101 is 75%, 80%, 90% or 100%, which is not limited here.

In some embodiments, as shown in FIG. 5, in each pixel driving circuit group 12, an overlapping area S3 of the orthographic projection of the first connection pattern M1 on the substrate 101 and the orthographic projection of the third connection pattern M3 on the substrate 101 is in a range of 4 $\mu m^2$ to 10 $\mu m^2$, inclusive.

For example, in each pixel driving circuit group 12, the overlapping area S3 of the orthographic projection of the first connection pattern M1 on the substrate 101 and the orthographic projection of the third connection pattern M3 on the substrate 101 is 4 $\mu m^2$, 5 $\mu m^2$, 6 $\mu m^2$, 7 $\mu m^2$, 8 $\mu m^2$, 9 $\mu m^2$ or 10 $\mu m^2$, which is not limited here.

In the above embodiments of the present disclosure, the orthographic projection of the first connection pattern M1 on the substrate 101 is provided to cover the orthographic projection of the third connection pattern M3 on the substrate 101, so that the influence of the third connection pattern M3 on the light transmittance may be reduced. For example, such provision may increase the light transmittance of the array substrate 1 by about 0.19%.

Figure 11:
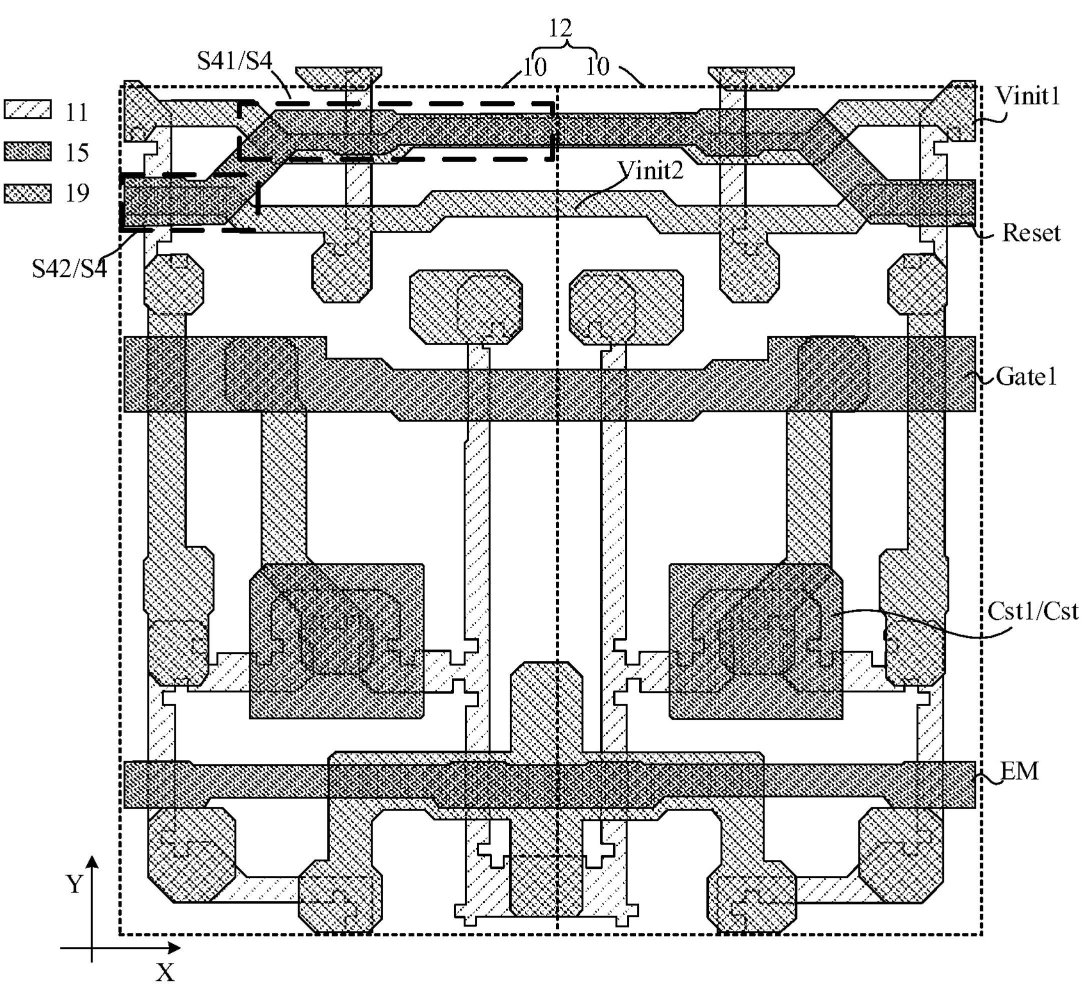
FIG. 11 is a structural diagram of a shielding layer, a first conductive layer and a fourth conductive layer, in accordance with some embodiments of the present disclosure.

In some embodiments, as shown in FIGS. 2, 10 and 11, the array substrate 1 includes a fourth conductive layer 19 disposed on a side of the first conductive layer 15 away from the substrate 101, and the fourth conductive layer 19 includes first initialization signal lines Vinit1 and second initialization signal lines Vinit2. Orthographic projections of a first initialization signal line Vinit1 and a second initialization signal line Vinit2 on the substrate 101 are both overlapped with an orthographic projection of the first conductive layer 15 on the substrate 101.

The first initialization signal line Vinit1 and the second initialization signal line Vinit2 are disposed in the fourth conductive layer 19, and the orthographic projections of the first initialization signal line Vinit1 and the second initialization signal line Vinit2 on the substrate 101 are overlapped with the orthographic projection of the first conductive layer 15 on the substrate 101. Such provision may reduce the influence of the first initialization signal line Vinit1 and the second initialization signal line Vinit2 on the light transmittance.

In some examples, as shown in FIG. 11, in each pixel driving circuit 10, an overlapping area S41 of an orthographic projection of the first initialization signal line Vinit1 on the substrate 101 and the orthographic projection of the first conductive layer 15 on the substrate 101 is larger than an overlapping area S42 of an orthographic projection of the second initialization signal line Vinit2 on the substrate 101 and the orthographic projection of the first conductive layer 15 on the substrate 101.

For example, an overlapping area S4 of the orthographic projections of the first initialization signal line Vinit1 and the second initialization signal line Vinit2 on the substrate 101 and the orthographic projection of the first conductive layer 15 on the substrate 101 is in a range of 15 $\mu m^2$ to 20 $\mu m^2$, inclusive.

For example, as shown in FIG. 11, the overlapping area of the orthographic projection of the first initialization signal line Vinit1 on the substrate 101 and the orthographic projection of the first conductive layer 15 on the substrate 101 is denoted as the area S41, and the overlapping area of the orthographic projection of the second initialization signal line Vinit2 on the substrate 101 and the orthographic projection of the first conductive layer 15 on the substrate 101 is denoted as the area S42. It can be understood that S4 is equal to a sum of S41 and S42 (i.e., S4=S41+S42).

For example, the overlapping area S4 of the orthographic projections of the first initialization signal line Vinit1 and the second initialization signal line Vinit2 on the substrate 101 and the orthographic projection of the first conductive layer 15 on the substrate 101 is 15 $\mu m^2$, 16 $\mu m^2$, 17 $\mu m^2$, 18 $\mu m^2$, 19 $\mu m^2$ or 20 $\mu m^2$, which is not limited here.

For example, in each pixel driving circuit 10, a ratio of the overlapping area S41 of the orthographic projection of the first initialization signal line Vinit1 on the substrate 101 and the orthographic projection of the first conductive layer 15 on the substrate 101 to the overlapping area S42 of the orthographic projection of the second initialization signal line Vinit2 on the substrate 101 and the orthographic projection of the first conductive layer 15 on the substrate 101 is greater than 1.5.

In some examples, as shown in FIG. 11, in each pixel driving circuit 10, the overlapping area S41 of the orthographic projection of the first initialization signal line Vinit1 on the substrate 101 and the orthographic projection of the first conductive layer 15 on the substrate 101 is in a range of 12 $\mu m^2$ to 19 $\mu m^2$, inclusive, and the overlapping area S42 of the orthographic projection of the second initialization signal line Vinit2 on the substrate 101 and the orthographic projection of the first conductive layer 15 on the substrate 101 is in a range of 1 $\mu m^2$ to 3 $\mu m^2$, inclusive.

For example, in each pixel driving circuit 10, the overlapping area S41 of the orthographic projection of the first initialization signal line Vinit1 on the substrate 101 and the orthographic projection of the first conductive layer 15 on the substrate 101 is 12 $\mu m^2$, 13 $\mu m^2$, 14 $\mu m^2$, 15 $\mu m^2$, 16 $\mu m^2$, 17 $\mu m^2$ or 19 $\mu m^2$, which is not limited here.

For example, in each pixel driving circuit 10, the overlapping area S42 of the orthographic projection of the second initialization signal line Vinit2 on the substrate 101 and the orthographic projection of the first conductive layer 15 on the substrate 101 is 1 $\mu m^2$, 2 $\mu m^2$, or 3 $\mu m^2$, which is not limited here.

In the embodiments of the present disclosure, the provision of the orthographic projections of the first initialization signal line Vinit1 and the second initialization signal line Vinit2 on the substrate 101 each overlapped with the orthographic projection of the first conductive layer 15 on the substrate 101 may reduce the influence of the first initialization signal line Vinit1 and the second initialization signal line Vinit2 on the light transmittance. For example, such provision may increase the light transmittance of the array substrate 1 by about 0.94%.

In some examples, as shown in FIGS. 10 and 11, the array substrate 1 includes reset signal lines Reset. The reset signal lines Reset are located in the first conductive layer 15, and the orthographic projections of the first initialization signal line Vinit1 and the second initialization signal line Vinit2 on the substrate 101 are overlapped with an orthographic projection of a reset signal line Reset on the substrate 101.

For example, as shown in FIG. 11, the reset signal line Reset is disposed in the first conductive layer 15, the first initialization signal line Vinit1 and the second initialization signal line Vinit2 are disposed in the fourth conductive layer 19. Compared with a case that the first initialization signal line Vinit1 and the second initialization signal line Vinit2 are disposed in the second conductive layer 17, a distance between the reset signal line Reset and both the first initialization signal line Vinit1 and the second initialization signal line Vinit2 in a direction perpendicular to a plane where the substrate 101 is located is relatively large. In a case where the orthographic projection of the reset signal line Reset on the substrate 101 is overlapped with the orthographic projections of the first initialization signal line Vinit1 and the second initialization signal line Vinit2 on the substrate 101, the problem of electrostatic breakdown caused by overlap of the signal lines may be effectively prevented, and the light transmittance of the array substrate 1 may be improved.

In some embodiments, as shown in FIG. 12, the first semiconductor layer 13 includes active layer patterns of a first reset transistor T1, a driving transistor T3, a data writing transistor T4, a first light emission control transistor T5, a second light emission control transistor T6 and a second reset transistor T7. The active layer pattern of each transistor includes a source and a drain of the transistor, and a channel region between the two. The second semiconductor layer includes an active layer pattern of a compensation transistor T2.

For example, the first conductive layer 15 includes gates of the first reset transistor T1, the driving transistor T3, the data writing transistor T4, the first light emission control transistor T5, the second light emission control transistor T6 and the second reset transistor T7, and a first electrode plate Cst1 of a capacitor Cst. The gate of each transistor is overlapped with the channel region thereof, thereby forming the above transistor. The first conductive layer further includes the first scan signal line Gate1, the light emission control signal line EM and the reset signal line Reset.

The second conductive layer 17 includes the first scan signal sub-line 2G2, and the third conductive layer 62 includes the second scan signal sub-line 3G2. The first scan signal sub-line 2G2 and the second scan signal sub-line 3G2 are connected to form a second scan signal line Gate2.

The fourth conductive layer 19 includes the first initialization signal line Vinit1 and the second initialization signal line Vinit2.

The fifth conductive layer 21 includes the data signal line Data and the power supply signal line ELVDD.

As for the connection relationship of the signal lines and the transistors, reference may be made to the above introduction, and details are not repeated here.

In some embodiments, as shown in FIG. 12, the array substrate 1 further includes a shielding layer 11 disposed between the substrate 101 and the first conductive layer 15. In the first direction X, a second connection pattern M2 is connected between shielding patterns 111 of two adjacent pixel driving circuits 10 between at least two adjacent pixel driving circuit groups 12. The second connection pattern M2 is located in the shielding layer 11. The array substrate 1 further includes light emission control signal lines EM.

The pixel driving circuit 10 further includes a second light emission control transistor T6. A gate of the second light emission control transistor T6 is connected to a light emission control signal line EM, a first electrode of the second light emission control transistor T6 is connected to the second electrode T32 of the driving transistor T3.

For example, the gate of the second light emission control transistor T6 and the light emission control signal line EM have an integrated structure.

Between two adjacent pixel driving circuit groups 12, a region between first electrodes of two adjacent second light emission control transistors T6 and between the second connection pattern M2 and the light emission control signal line EM is a first light transmissive region W1, and an area of the first light transmissive region W1 is greater than 10 $\mu m^2$.

For example, the area of the first light transmissive region W1 is 15 $\mu m^2$, 20 $\mu m^2$, 25 $\mu m^2$ or 30 $\mu m^2$, which is not limited here.

It will be noted that in the array substrate provided by some embodiments of the present disclosure, the shielding layer 11, the first semiconductor layer 13, the first conductive layer 15, the second conductive layer 17, the second semiconductor layer 61, the third conductive layer 62, the fourth conductive layer 19, the fifth conductive layer 21 and other conductive film layers are all opaque film layers. For example, the first conductive layer 15, the second conductive layer 17, the third conductive layer 62, the fourth conductive layer 19 and the fifth conductive layer 21 are usually made of opaque metal layers, and the light transmissive region may be a region between the anode and the substrate, and excluding conductive layer patterns and the semiconductor layer patterns. If the conductive layer is made of a transparent conductive layer such as indium tin oxide ITO, the region may also be regarded as the light transmissive region.

In some embodiments, as shown in FIG. 12, the array substrate 1 further includes first initialization signal lines Vinit1 and light emission control signal lines EM. The pixel driving circuit 10 further includes a first reset transistor T1, a second light emission control transistor T6 and a second reset transistor T7. A first electrode of the first reset transistor T1 is connected to a first initialization signal line Vinit1, a second electrode T12 of the first reset transistor T1 is connected to a first electrode of the second light emission control transistor T6, and a second electrode of the second light emission control transistor T6 is connected to a second electrode of the second reset transistor T7. The first electrode of the second light emission control transistor T6 is connected to a second electrode T32 of the driving transistor T3, and a gate of the second light emission control transistor T6 is connected to a light emission control signal line EM.

Between two adjacent pixel driving circuit groups 12, a region between second electrodes of two adjacent second light emission control transistors T6 and between the first initialization signal line Vinit1 and the light emission control signal line EM is a second light transmissive region W2, and an area of the second light transmissive region W2 is greater than 10 $\mu m^2$.

For example, the area of the second light transmissive region W2 is 15 $\mu m^2$, 20 $\mu m^2$, 25 $\mu m^2$ or 30 $\mu m^2$, which is not limited here.

The area of the first light transmissive region W1 is set to be greater than 10 $\mu m^2$ and the area of the second light transmissive region W2 is set to be greater than 10 $\mu m^2$, so that the light transmittance of the array substrate 1 may be improved.

In some embodiments of the present disclosure, as shown in FIGS. 2 and 4, the array substrate 1 includes a substrate 101 and a plurality of pixel driving circuit groups 12 disposed on the substrate 101. The plurality of pixel driving circuit groups 12 are arranged in an array in a first direction X and a second direction Y, and the first direction X intersects the second direction Y. Each pixel driving circuit group 12 includes two pixel driving circuits 10 arranged in the first direction X.

As shown in FIGS. 2 and 12, the array substrate 1 further includes a first conductive layer 15 disposed on the substrate 101, a second conductive layer 17 disposed on a side of the first conductive layer 15 away from the substrate 101, and a fifth conductive layer 21. For example, the fifth conductive layer 21 is provided with power supply signal lines ELVDD and data signal lines Data therein.

By considering a 7T1C pixel driving circuit 10 as an example, as shown in FIGS. 3A to 5, the pixel driving circuit 10 includes a driving transistor T3 and a capacitor Cst. The capacitor Cst includes a first electrode plate Cst1 and a second electrode plate Cst2. The first electrode plate Cst1 is connected to a gate T33 of the driving transistor T3. The first electrode plate Cst1 is located in the first conductive layer 15, and the second electrode plate Cst2 is located in the second conductive layer 17. As shown in FIG. 12, the second electrode plate Cst2 is connected to the fifth conductive layer 21. For example, the second electrode plate Cst2 of the capacitor Cst is electrically connected to the power supply signal line ELVDD in the fifth conductive layer 21.

Since the second electrode plate Cst2 of the capacitor Cst of each pixel driving circuit 10 needs to be connected to the power supply signal line ELVDD, multiple second electrode plates Cst2 of multiple capacitors Cst may be connected, so as to reduce a voltage drop in a power supply signal provided by the power supply signal line ELVDD during transmission. Based on this, as shown in FIG. 4, a first connection pattern M1 is connected between the second electrode plates Cst2 of the two pixel driving circuits 10 in the pixel driving circuit group 12, and the first connection pattern M1 is located in the second conductive layer 17. A dimension d1 of the first connection pattern M1 in the second direction is less than a dimension d2 of the second electrode plate Cst2 in the second direction Y.

It will be noted that the dimension d1 of the first connection pattern M1 in the second direction Y refers to a maximum dimension of the first connection pattern M1 in the second direction Y, and the dimension d2 of the second electrode plate Cst2 in the second direction Y refers to a maximum dimension of the second electrode plate Cst2 in the second direction Y.

For example, the first connection pattern M1 is connected to the second electrode plate Cst2 of the two pixel driving circuits 10 in the pixel driving circuit group 12. The first connection pattern M1 and the second electrode plate Cst2 of the two pixel driving circuits 10 in the pixel driving circuit group 12 have an integrated structure, which may simplify the structure and the manufacturing process of the array substrate 1.

For example, as shown in FIG. 4, in a pixel driving circuit group 12, the second electrode plates Cst2 of the two pixel driving circuits 10 are connected by the first connection pattern M1, and the two pixel driving circuits 10 may receive the same power supply signal. Since the first connection pattern M1 plays a role of transmitting the power supply signal in the pixel driving circuit group 12, the setting of the dimension d1 of the first connection pattern M1 in the second direction Y being less than the dimension d2 of the second electrode plate Cst2 in the second direction Y may not affect the transmission of the power supply signal. Thus, the dimension d1 of the first connection pattern M1 in the second direction Y is set to be less than the dimension d2 of the second electrode plate Cst2 in the second direction Y. Such setting may increase light transmittance of a region S1 between the two second electrode plates Cst2 in the pixel driving circuit group 12.

In some embodiments, as shown in FIGS. 3A and 4, the array substrate further includes second scan signal lines Gate2.

The pixel driving circuit further includes a compensation transistor T2. A first electrode of the compensation transistor T2 is connected to a gate of the driving transistor T3, a second electrode of the compensation transistor T2 is connected to a second electrode of the driving transistor T3, and a gate of the compensation transistor T2 is connected to a second scan signal line Gate2.

As shown in FIG. 2, the array substrate 1 further includes a shielding layer 11 disposed on the substrate 101, a first semiconductor layer 13, a first conductive layer 15, a second conductive layer 17, a second semiconductor layer 61, a third conductive layer 62 and a fourth conductive layer 19 that are arranged in sequence in a direction away from the shielding layer 11, and a fifth conductive layer 21 located on a side of the fourth conductive layer 19 away from the substrate 101.

As shown in FIG. 10, an active layer pattern of the driving transistor T3 is located in the first semiconductor layer 13.

The second scan signal line is at least partially located in the third conductive layer 62. The second scan signal line Gate2 includes a first scan signal sub-line 2G2 located in the second conductive layer 17 and a second scan signal sub-line 3G2 located in the third conductive layer 62. The first scan signal sub-line 2G2 and the second scan signal sub-line 3G2 are connected to form the second scan signal line Gate2. The active layer pattern of the compensation transistor T2 is located in the second semiconductor layer 61. A portion of the second scan signal sub-line 3G2 passing through the active layer pattern of the compensation transistor T2 serves as the gate of the compensation transistor T2.

As shown in FIGS. 9 and 10, the second electrode of the compensation transistor T2 is connected to the second electrode of the driving transistor T3 by a first pattern H1, and the first pattern H1 is located in the fourth conductive layer 19.

In some examples, with continued reference to FIGS. 9 and 10, the first pattern H1 is connected to the second electrode T32 of the driving transistor T3 through a third via K3, and the first pattern H1 is also connected to the second electrode of the compensation transistor T2 through a first via K1. A pixel driving circuit 10 includes two first via holes K1, which are denoted as a No. 1 via hole K11 and a No. 2 via hole K12. As shown in FIG. 10, an end of the first pattern H1 is connected to a second electrode T12 of a first reset transistor T1 through a via hole, and the other end of the first pattern H1 is connected to the second electrode T22 of the compensation transistor T2 through the No. 2 via hole K12. The third via K3 sequentially extends through the third insulation layer 107, the third gate dielectric layer 106, the second insulation layer 105, the second gate dielectric layer 104 and the first gate dielectric layer 103 from the fourth conductive layer 19 to the first semiconductor layer 13, so that the first pattern H1 is connected to the second electrode T32 of the driving transistor T3 through the third via K3. The No. 2 via hole K12 in the first via holes K1 sequentially extends through the third insulation layer 107 and the third gate dielectric layer 106 from the fourth conductive layer 19 to the first semiconductor layer 13, so that the first pattern H1 is further connected to the second electrode of the compensation transistor T2 through the first via K1.

In some embodiments, the first connection pattern M1 is not overlapped with the first via holes K1 and the third via hole K3.

In some embodiments, as shown in FIGS. 7A and 7B, the shielding layer 11 includes a plurality of shielding patterns 111.

In the first direction X, a second connection pattern M2 is connected between shielding patterns of two adjacent pixel driving circuits between at least two adjacent pixel driving circuit groups 12, and the second connection pattern M2 is located in the shielding layer 11. For the specific description of the second connection pattern M2, reference may be made to the previous description, and details are not repeated. The second connection pattern M2 is not overlapped with the third via hole K3.

The first connection pattern M1 and the second connection pattern M2 are provided not overlapped with the third via hole K3, so that during the operation of the pixel driving circuit, in the data writing and Vth compensation phase t2, parasitic capacitance coupling between the second electrode of the driving transistor and a constant voltage line may be reduced, so as to avoid affecting the compensation effect, thereby preventing a luminous effect of the light-emitting device from being affected.

In some embodiments, the shielding pattern 111 and the second connection pattern M2 are used to receive a constant voltage signal. For example, the shielding layer 11 may receive the constant voltage signal, such as the power supply signal VDD, the reference voltage signal VSS or the initialization signal Vinit. These constant voltage signals may be received to the shielding layer 11 in the display region from the peripheral region of the array substrate.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. An array substrate, comprising a substrate, a plurality of pixel driving circuit groups disposed on the substrate, and a first connection pattern; the plurality of pixel driving circuit groups being arranged in an array in a first direction and a second direction, the first direction intersecting the second direction; wherein each pixel driving circuit group comprises two pixel driving circuits arranged in the first direction;

the array substrate further comprising a first conductive layer disposed on the substrate, a second conductive layer disposed on a side of the first conductive layer away from the substrate, and power supply signal lines; wherein the pixel driving circuits each comprise a driving transistor and a capacitor; the capacitor comprises a first electrode plate and a second electrode plate, the first electrode plate is connected to a gate of the driving transistor, and the second electrode plate is connected to a power supply signal line;

the first electrode plate is located in the first conductive layer, and the second electrode plate is located in the second conductive layer; a first connection pattern is connected between second electrode plates of the two pixel driving circuits in the pixel driving circuit group, and the first connection pattern is located in the second conductive layer; and a dimension of the first connection pattern in the second direction is less than a dimension of the second electrode plate in the second direction.

2. The array substrate according to claim 1, wherein a ratio of the dimension of the first connection pattern in the second direction to the dimension of the second electrode plate in the second direction is in a range of 10% to 50%, inclusive; and/or the dimension of the first connection pattern in the second direction is in a range of 2.0 μm to 5.5 μm, inclusive.

3. The array substrate according to claim 1, further comprising a shielding layer disposed between the substrate and the first conductive layer; the shielding layer comprising a plurality of shielding patterns and a second connection pattern, and at least one of the pixel driving circuits comprising a shielding pattern in the plurality of shielding patterns; wherein in the first direction, between at least two adjacent pixel driving circuit groups, a second connection pattern is connected between shielding patterns of two adjacent pixel driving circuits; and the array substrate further comprising a second semiconductor layer, the second semiconductor layer being located on a side of the second conductive layer away from the substrate, wherein an orthographic projection of the second connection pattern on the substrate is overlapped with an orthographic projection of the second semiconductor layer on the substrate.

4. The array substrate according to claim 3, further comprising a third gate dielectric layer and a third insulating layer that are disposed on a side of the second semiconductor layer away from the substrate; wherein the third gate dielectric layer and the third insulating layer are provided with at least one first via hole therein, the at least one first via hole extends through the third gate dielectric layer and the third insulating layer to the second semiconductor layer, and an orthogonal projection of the at least one first via hole on the substrate is overlapped with the orthographic projection of the second connection pattern on the substrate.

5. The array substrate according to claim 1, further comprising a shielding layer disposed between the substrate and the first conductive layer; the shielding layer comprising a plurality of shielding patterns and a third connection pattern, and the pixel driving circuits each comprising a shielding pattern in the plurality of shielding patterns, wherein in the pixel driving circuit group, the third connection pattern is connected between shielding patterns of the two pixel driving circuits; and an overlapping area of an orthographic projection of the first connection pattern on the substrate and an orthographic projection of the third connection pattern on the substrate is greater than 70% of the orthographic projection of the first connection pattern on the substrate.

6. The array substrate according to claim 1, further comprising a fourth conductive layer disposed on a side of the second conductive layer away from the substrate, and the fourth conductive layer comprising a first initialization signal line and a second initialization signal line; wherein orthographic projections of the first initialization signal line and the second initialization signal line on the substrate are both overlapped with an orthographic projection of the first conductive layer on the substrate.

7. The array substrate according to claim 6, wherein in each pixel driving circuit, an overlapping area of an orthographic projection of the first initialization signal line on the substrate and the orthographic projection of the first conductive layer on the substrate is greater than an overlapping area of an orthographic projection of the second initialization signal line on the substrate and the orthographic projection of the first conductive layer on the substrate; and/or in each pixel driving circuit, a ratio of the overlapping area of the orthographic projection of the first initialization signal line on the substrate and the orthographic projection of the first conductive layer on the substrate to the overlapping area of the orthographic projection of the second initialization signal line on the substrate and the orthographic projection of the first conductive layer on the substrate greater than 1.5.

8. The array substrate according to claim 6, further comprising a reset signal line, wherein the reset signal line is located in the first conductive layer, and the orthographic projections of the first initialization signal line and the second initialization signal line on the substrate are both overlapped with an orthographic projection of the reset signal line on the substrate.

9. The array substrate according to claim 1, further comprising a shielding layer disposed on the substrate, a first semiconductor layer, a second semiconductor layer, a third conductive layer and a fourth conductive layer, wherein the first semiconductor layer, the first conductive layer, the second conductive layer, the second semiconductor layer, the third conductive layer and the fourth conductive layer are disposed in sequence in a direction away from the shielding layer; wherein a material of the first semiconductor layer comprises low-temperature polysilicon; and a material of the second semiconductor layer comprises indium gallium zinc oxide.

10. The array substrate according to claim 1, further comprising a shielding layer disposed between the substrate and the first conductive layer; the shielding layer comprising a plurality of shielding patterns and a second connection pattern, and the pixel driving circuits each comprising a shield pattern in the plurality of shielding patterns; wherein in the first direction, between at least two adjacent pixel driving circuit groups, a second connection pattern is connected between shielding patterns of two adjacent pixel driving circuits;

the array substrate further comprising a light emission control signal line; wherein the pixel driving circuits each further comprise a second light emission control transistor; a gate of the second light emission control transistor is connected to the light emission control signal line, and a first electrode of the second light emission control transistor is connected to a second electrode of the driving transistor; and between two adjacent pixel driving circuit groups, a region between first electrodes of two adjacent second light emission control transistors and between the second connection pattern and the light emission control signal line is a first light transmissive region, and an area of the first light transmissive region is greater than 10 $\mu m^2$.

11. The array substrate according to claim 1, further comprising a first initialization signal line, a light emission control signal line and a second scan signal line, wherein the pixel driving circuits each further comprise a first reset transistor, a second light emission control transistor, a second reset transistor and a compensation transistor; a first electrode of the first reset transistor is connected to the first initialization signal line, and a second electrode of the first reset transistor is connected to a first electrode of the compensation transistor; a second electrode of the second light emission control transistor is connected to a second electrode of the second reset transistor, a first electrode of the second light emission control transistor is connected to a second electrode of the driving transistor, and a gate of the second light emission control transistor is connected to the light emission control signal line; a gate of the compensation transistor is connected to the second scan signal line; and between two adjacent pixel driving circuit groups, a region between second electrodes of two adjacent second light emission control transistors and between the first initialization signal line and the light emission control signal line is a second light transmissive region, and an area of the second light transmissive region is greater than 10 $\mu m^2$.

12. A display panel, comprising:

the array substrate according to claim 1; and a plurality of light-emitting devices disposed on a plurality of pixel driving circuits in the array substrate; the array substrate being used to drive the plurality of light-emitting devices to emit light.

13. A display apparatus, comprising:

the display panel according to claim 12; and a driver chip used to drive the display panel for display.

14. An array substrate, comprising a substrate, a plurality of pixel driving circuit groups disposed on the substrate, and a first connection pattern; the plurality of pixel driving circuit groups being arranged in an array in a first direction and a second direction, the first direction intersecting the second direction; wherein each pixel driving circuit group comprises two pixel driving circuits arranged in the first direction;

the array substrate comprising a first conductive layer disposed on the substrate, a second conductive layer disposed on a side of the first conductive layer away from the substrate, and a fifth conductive layer; wherein the pixel driving circuits each comprise a driving transistor and a capacitor; the capacitor comprises a first electrode plate and a second electrode plate, the first electrode plate is connected to a gate of the driving transistor, and the second electrode plate is connected to the fifth conductive layer;

the first electrode plate is located in the first conductive layer, and the second electrode plate is located in the second conductive layer; a first connection pattern is connected between second electrode plates of the two pixel driving circuits in the pixel driving circuit group, and the first connection pattern is located in the second conductive layer; and a dimension of the first connection pattern in the second direction is less than a dimension of the second electrode plate in the second direction.

15. The array substrate according to claim 14, further comprising a second scan signal line; wherein the pixel driving circuits each further comprise a compensation transistor, a first electrode of the compensation transistor is connected to the gate of the driving transistor, a second electrode of the compensation transistor is connected to a second electrode of the driving transistor by a first pattern, and a gate of the compensation transistor is connected to the second scan signal line; and the array substrate further comprising a shielding layer disposed on the substrate, a first semiconductor layer, a second semiconductor layer, the first conductive layer and a fourth conductive layer, wherein the first semiconductor layer, a first conductive layer, the second conductive layer, the second semiconductor layer, the third conductive layer and the fourth conductive layer are disposed in sequence in a direction away from the shielding layer; wherein an active layer pattern of the driving transistor is located in the first semiconductor layer;

the second scan signal line is at least partially located in the third conductive layer;

an active layer pattern of the compensation transistor is located in the second semiconductor layer; and the first pattern is located in the fourth conductive layer.

16. The array substrate according to claim 15, wherein the first pattern is connected to the second electrode of the driving transistor through a third via, and the first pattern is further connected to the second electrode of the compensation transistor through a first via; and the first connection pattern is not overlapped with both the first via hole and the third via hole.

17. The array substrate according to claim 16, wherein the shielding layer comprises a plurality of shielding patterns and a second connection pattern; and the pixel driving circuits each comprise a shielding pattern in plurality of shielding pattern;

in the first direction, between at least two adjacent pixel driving circuit groups, a second connection pattern is connected between shielding patterns of two adjacent pixel driving circuits; and the second connection pattern is not overlapped with the third via hole.

18. The array substrate according to claim 17, wherein the shielding patterns and the second connection pattern are used to receive a constant voltage signal.

19. A display panel, comprising:

the array substrate according to claim 14; and a plurality of light-emitting devices disposed on a plurality of pixel driving circuits in the array substrate; the array substrate being used to drive the plurality of light-emitting devices to emit light.

20. A display apparatus, comprising:

the display panel according to claim 19; and a driver chip used to drive the display panel for display.

* * * * *